(12) United States Patent
Maekawa

(10) Patent No.: US 6,917,079 B2
(45) Date of Patent: Jul. 12, 2005

(54) THIN FILM TRANSISTOR AND METHOD OF MANUFACTURING THE SAME

(75) Inventor: Shinji Maekawa, Kanagawa (JP)

(73) Assignee: Semiconductor Energy Laboratory Co., Ltd., Kanagawa-ken (JP)

(*) Notice: Subject to any disclaimer, the term of this patent is extended or adjusted under 35 U.S.C. 154(b) by 0 days.

(21) Appl. No.: 10/930,905

(22) Filed: Sep. 1, 2004

(65) Prior Publication Data

US 2005/0029523 A1 Feb. 10, 2005

Related U.S. Application Data

(62) Division of application No. 10/640,299, filed on Aug. 14, 2003.

(30) Foreign Application Priority Data

Aug. 22, 2002 (JP) .......................................... 2002-241706

(51) Int. Cl.[7] .......................... H01L 27/01; H01L 27/12; H01L 31/0392; H01L 29/04; H01L 31/036
(52) U.S. Cl. ............................ 257/350; 257/59; 257/72
(58) Field of Search ............................ 257/59, 72, 350

(56) References Cited

U.S. PATENT DOCUMENTS

| | | | |
|---|---|---|---|
| 5,514,879 A | 5/1996 | Yamazaki | |
| 5,529,937 A | 6/1996 | Zhang et al. | |
| 5,608,232 A | 3/1997 | Yamazaki et al. | |
| 5,614,732 A | 3/1997 | Yamazaki | |
| 5,639,698 A | 6/1997 | Yamazaki et al. | |
| 5,700,333 A | 12/1997 | Yamazaki et al. | |
| 5,712,191 A | 1/1998 | Nakajima et al. | |
| 5,773,327 A | 6/1998 | Yamazaki et al. | |
| 5,789,284 A | 8/1998 | Yamazaki et al. | |
| 5,814,540 A | 9/1998 | Takemura et al. | |
| 5,824,579 A | 10/1998 | Subramanian et al. | |

(Continued)

FOREIGN PATENT DOCUMENTS

| | | |
|---|---|---|
| JP | 2001-223219 | 8/2001 |
| JP | 2002-203789 | 7/2002 |

*Primary Examiner*—Ngân V. Ngô
(74) *Attorney, Agent, or Firm*—Nixon Peabody LLP; Jeffrey L. Costellia

(57) ABSTRACT

A metal element typified by Ni has an adverse effect on device properties of a TFT, and consequently, a step for removing the elements (hereinafter referred to as a gettering step) has been carried out. However, gettering steps as described above have the disadvantage of high cost due to an increase in the number of steps. Accordingly, a manufacturing method of a crystalline semiconductor film, which does not require a gettering step, has been in demand.

A TFT of the present invention is characterized by reducing the concentration of the metal element, typically Ni, in the crystalline semiconductor film to less than $4 \times 10^{16}$ atoms/cm$^3$, more specifically, $5 \times 10^{15}$ atoms/cm$^3$ to $3 \times 10^{16}$ atoms/cm$^3$, preferably, $7 \times 10^{15}$ atoms/cm$^3$ to $3 \times 10^{16}$ atoms/cm$^3$. And the present invention enables crystallization even by the metal element with a low concentration and an omission of a gettering step.

9 Claims, 12 Drawing Sheets

U.S. PATENT DOCUMENTS

| | | |
|---|---|---|
| 5,859,445 A | 1/1999 | Yamazaki |
| 5,869,363 A | 2/1999 | Yamazaki et al. |
| 5,888,857 A | 3/1999 | Zhang et al. |
| 5,888,858 A | 3/1999 | Yamazaki et al. |
| 5,893,730 A | 4/1999 | Yamazaki et al. |
| 5,897,347 A | 4/1999 | Yamazaki et al. |
| 5,915,174 A | 6/1999 | Yamazaki et al. |
| 5,937,282 A | 8/1999 | Nakajima et al. |
| 5,949,115 A | 9/1999 | Yamazaki et al. |
| 5,953,597 A | 9/1999 | Kusumoto et al. |
| 5,956,579 A | 9/1999 | Yamazaki et al. |
| 5,961,743 A | 10/1999 | Yamazaki et al. |
| 5,977,559 A | 11/1999 | Zhang et al. |
| 5,985,740 A | 11/1999 | Yamazaki et al. |
| 6,011,277 A | 1/2000 | Yamazaki |
| 6,027,987 A | 2/2000 | Yamazaki et al. |
| 6,048,758 A | 4/2000 | Yamazaki et al. |
| 6,063,654 A | 5/2000 | Ohtani |
| 6,066,518 A | 5/2000 | Yamazaki |
| 6,071,764 A | 6/2000 | Zhang et al. |
| 6,071,766 A | 6/2000 | Yamazaki et al. |
| 6,072,193 A | 6/2000 | Ohnuma et al. |
| 6,077,731 A | 6/2000 | Yamazaki et al. |
| 6,077,758 A | 6/2000 | Zhang et al. |
| 6,084,247 A | 7/2000 | Yamazaki et al. |
| 6,087,679 A | 7/2000 | Yamazaki et al. |
| 6,093,934 A | 7/2000 | Yamazaki et al. |
| 6,100,562 A | 8/2000 | Yamazaki et al. |
| 6,121,660 A | 9/2000 | Yamazaki et al. |
| 6,133,073 A | 10/2000 | Yamazaki et al. |
| 6,133,075 A | 10/2000 | Yamazaki et al. |
| 6,133,119 A | 10/2000 | Yamazaki |
| 6,144,041 A | 11/2000 | Yamazaki et al. |
| 6,153,445 A | 11/2000 | Yamazaki et al. |
| 6,156,590 A | 12/2000 | Yamazaki et al. |
| 6,156,628 A | 12/2000 | Ohnuma et al. |
| 6,160,268 A | 12/2000 | Yamazaki |
| 6,162,704 A | 12/2000 | Yamazaki et al. |
| 6,165,824 A | 12/2000 | Takano et al. |
| 6,168,980 B1 | 1/2001 | Yamazaki et al. |
| 6,184,559 B1 | 2/2001 | Hayakawa et al. |
| 6,194,255 B1 | 2/2001 | Hiroki et al. |
| 6,197,624 B1 | 3/2001 | Yamazaki |
| 6,201,585 B1 | 3/2001 | Takano et al. |
| 6,204,099 B1 | 3/2001 | Kusumoto et al. |
| 6,204,101 B1 | 3/2001 | Yamazaki et al. |
| 6,204,154 B1 | 3/2001 | Zhang et al. |
| 6,207,969 B1 | 3/2001 | Yamazaki |
| 6,218,219 B1 | 4/2001 | Yamazaki et al. |
| 6,225,152 B1 | 5/2001 | Yamazaki et al. |
| 6,232,205 B1 | 5/2001 | Ohtani |
| 6,232,621 B1 | 5/2001 | Yamazaki et al. |
| 6,242,289 B1 | 6/2001 | Nakajima et al. |
| 6,242,290 B1 | 6/2001 | Nakajima et al. |
| 6,251,712 B1 | 6/2001 | Tanaka et al. |
| 6,265,745 B1 | 7/2001 | Kusumoto et al. |
| 6,281,520 B1 | 8/2001 | Yamazaki |
| 6,287,900 B1 | 9/2001 | Yamazaki et al. |
| 6,291,275 B1 | 9/2001 | Yamazaki et al. |
| 6,294,441 B1 | 9/2001 | Yamazaki |
| 6,300,659 B1 | 10/2001 | Zhang et al. |
| 6,303,415 B1 | 10/2001 | Yamazaki |
| 6,303,963 B1 | 10/2001 | Ohtani et al. |
| 6,307,214 B1 | 10/2001 | Ohtani et al. |
| 6,309,951 B1 | 10/2001 | Jang et al. |
| 6,310,363 B1 | 10/2001 | Ohnuma et al. |
| 6,316,789 B1 | 11/2001 | Yamazaki et al. |
| 6,316,810 B1 | 11/2001 | Yamazaki et al. |
| 6,323,070 B1 | 11/2001 | Yamazaki |
| 6,326,226 B1 | 12/2001 | Jang et al. |
| 6,331,457 B1 | 12/2001 | Yamazaki et al. |
| 6,331,722 B1 | 12/2001 | Yamazaki et al. |
| 6,337,235 B1 | 1/2002 | Miyanaga et al. |
| 6,348,367 B1 | 2/2002 | Ohtani et al. |
| 6,348,368 B1 | 2/2002 | Yamazaki et al. |
| 6,355,509 B1 | 3/2002 | Yamazaki |
| 6,356,223 B1 | 3/2002 | Tanaka |
| 6,368,904 B1 | 4/2002 | Yamazaki |
| 6,369,410 B1 | 4/2002 | Yamazaki et al. |
| 6,373,075 B1 | 4/2002 | Yamazaki et al. |
| 6,376,862 B1 | 4/2002 | Yamazaki |
| 6,380,007 B1 | 4/2002 | Koyama |
| 6,380,560 B1 | 4/2002 | Yamazaki et al. |
| 6,383,852 B2 | 5/2002 | Zhang et al. |
| 6,396,105 B1 | 5/2002 | Yamazaki et al. |
| 6,399,454 B1 | 6/2002 | Yamazaki |
| 6,407,430 B1 | 6/2002 | Ohtani et al. |
| 6,407,431 B2 | 6/2002 | Yamazaki et al. |
| 6,413,805 B1 | 7/2002 | Zhang et al. |
| 6,413,842 B2 | 7/2002 | Yamazaki et al. |
| 6,426,276 B1 | 7/2002 | Ohnuma et al. |
| 6,426,517 B2 | 7/2002 | Hayakawa et al. |
| 6,432,756 B1 | 8/2002 | Ohtani et al. |
| 6,433,363 B1 | 8/2002 | Yamazaki et al. |
| 6,444,390 B1 | 9/2002 | Yamazaki et al. |
| 6,452,211 B1 | 9/2002 | Ohtani et al. |
| 6,455,401 B1 | 9/2002 | Zhang et al. |
| 6,458,637 B1 | 10/2002 | Yamazaki et al. |
| 6,461,943 B1 | 10/2002 | Yamazaki et al. |
| 6,465,288 B1 | 10/2002 | Ohnuma |
| 6,469,317 B1 | 10/2002 | Yamazaki et al. |
| 6,475,840 B1 | 11/2002 | Miyanaga et al. |
| 6,478,263 B1 | 11/2002 | Yamazaki et al. |
| 6,479,329 B2 | 11/2002 | Nakajima et al. |
| 6,479,333 B1 | 11/2002 | Takano et al. |
| 6,482,684 B1 | 11/2002 | Yamazaki |
| 6,489,189 B2 | 12/2002 | Yamazaki et al. |
| 6,495,886 B1 | 12/2002 | Yamazaki et al. |
| 6,501,094 B1 | 12/2002 | Yamazaki et al. |
| 6,504,174 B1 | 1/2003 | Yamazaki et al. |
| 6,515,334 B2 | 2/2003 | Yamazaki et al. |
| 6,515,648 B1 | 2/2003 | Tanaka et al. |
| 6,518,102 B1 | 2/2003 | Tanaka et al. |
| 6,524,896 B1 | 2/2003 | Yamazaki et al. |
| 6,528,358 B1 | 3/2003 | Yamazaki et al. |
| 6,528,820 B1 | 3/2003 | Yamazaki et al. |
| 6,541,315 B2 | 4/2003 | Yamazaki et al. |
| 6,541,793 B2 | 4/2003 | Ohnuma et al. |
| 6,544,823 B1 | 4/2003 | Yamazaki et al. |
| 6,544,826 B1 | 4/2003 | Yamazaki et al. |
| 6,545,320 B2 | 4/2003 | Ohtani et al. |
| 6,551,907 B2 | 4/2003 | Ohtani |
| 6,563,482 B1 | 5/2003 | Yamazaki et al. |
| 6,690,068 B2 | 2/2004 | Yamazaki et al. |
| 2003/0001159 A1 | 1/2003 | Ohtani et al. |
| 2003/0122129 A1 | 7/2003 | Yamazaki et al. |

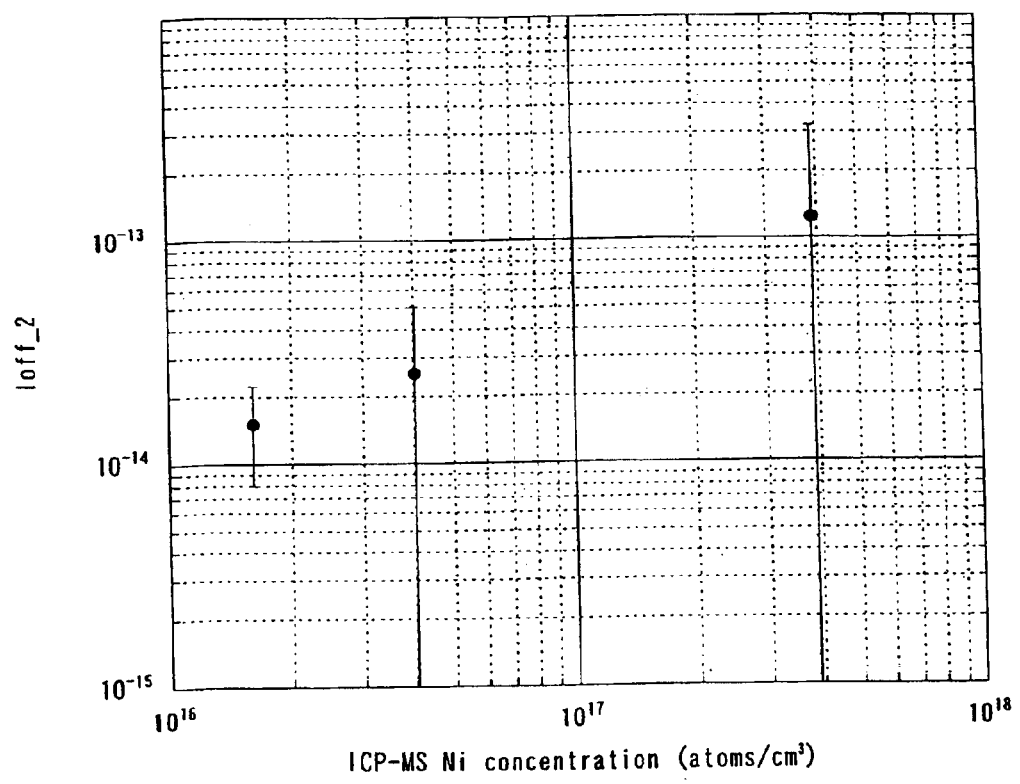
Fig. 1 ICP-MS Ni concentration vs. TFT $I_{off\_2}$

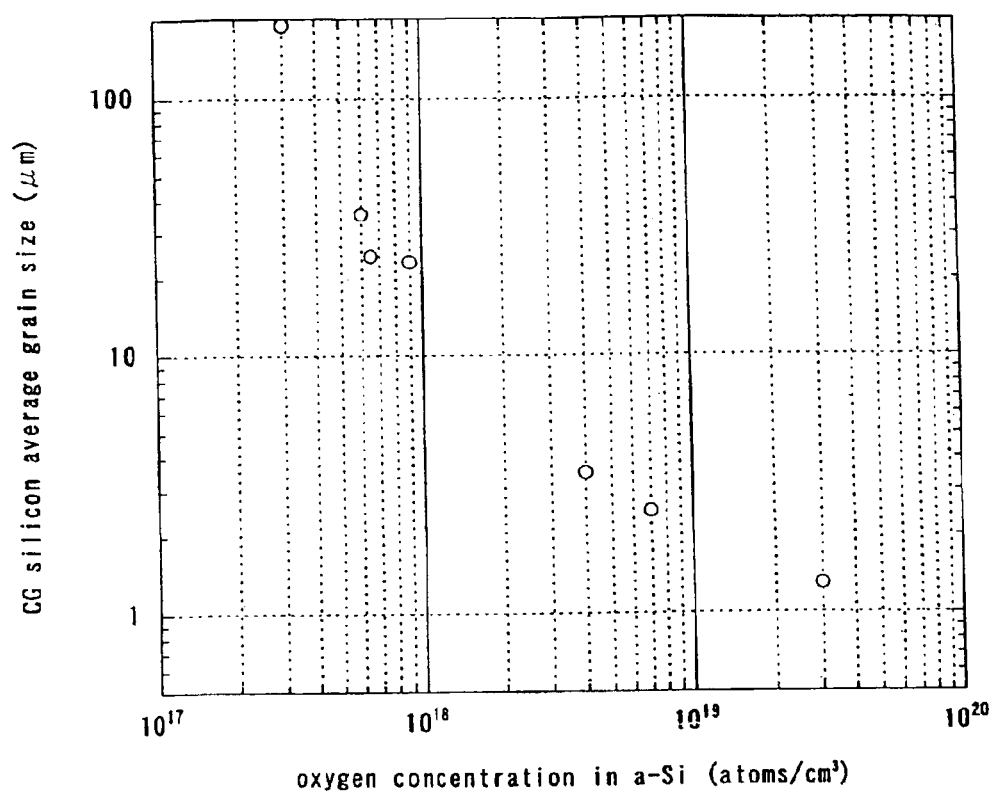
Fig. 2 Correlation between oxygen concentration in a-Si formed by LPCVD and grain size of CG silicon

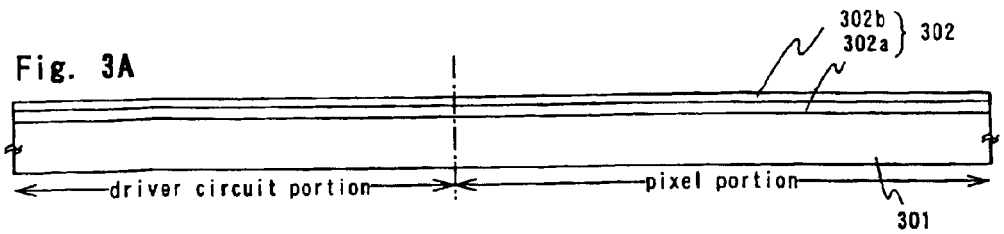
Fig. 3A
Fig. 3B
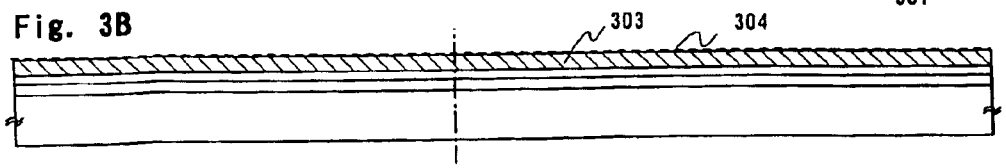
Fig. 3C
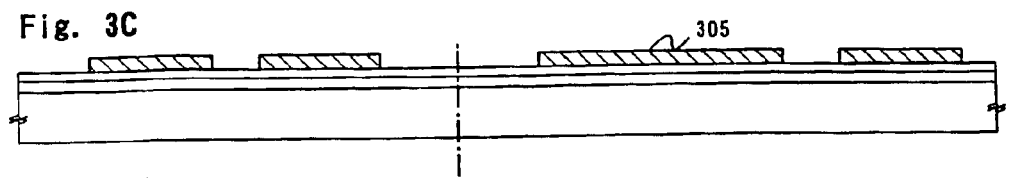
Fig. 3D
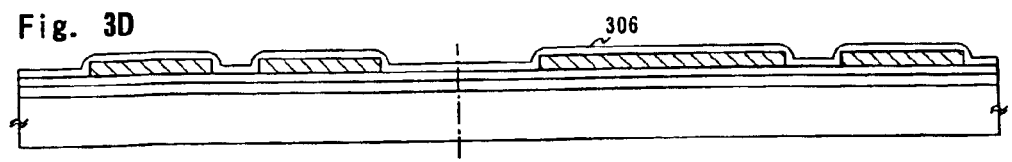
Fig. 3E
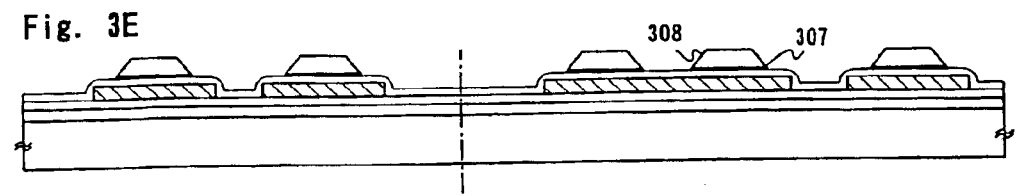
Fig. 3F
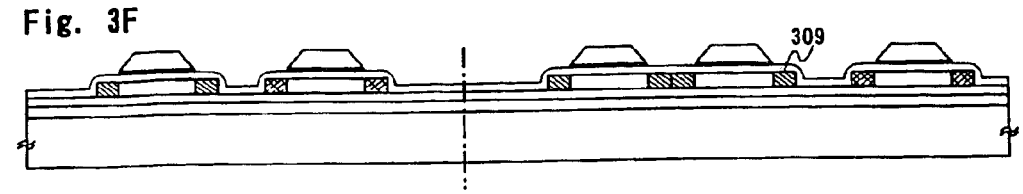
Fig. 3G
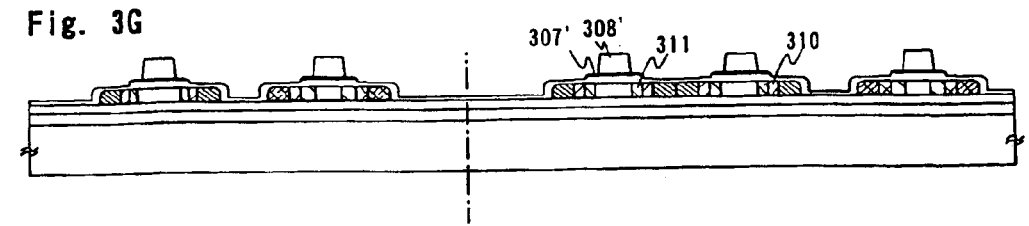

n-channel TFT  p-channel TFT | n-channel TFT  p-channel TFT
←——driver circuit portion——→ ←————pixel portion————→ driver circuit portion | 504 pixel portion | driver circuit portion n-channel TFT  p-channel TFT       n-channel TFT       p-channel TFT
←——driver circuit portion——→←————————pixel TFT————————→ driver circuit portion

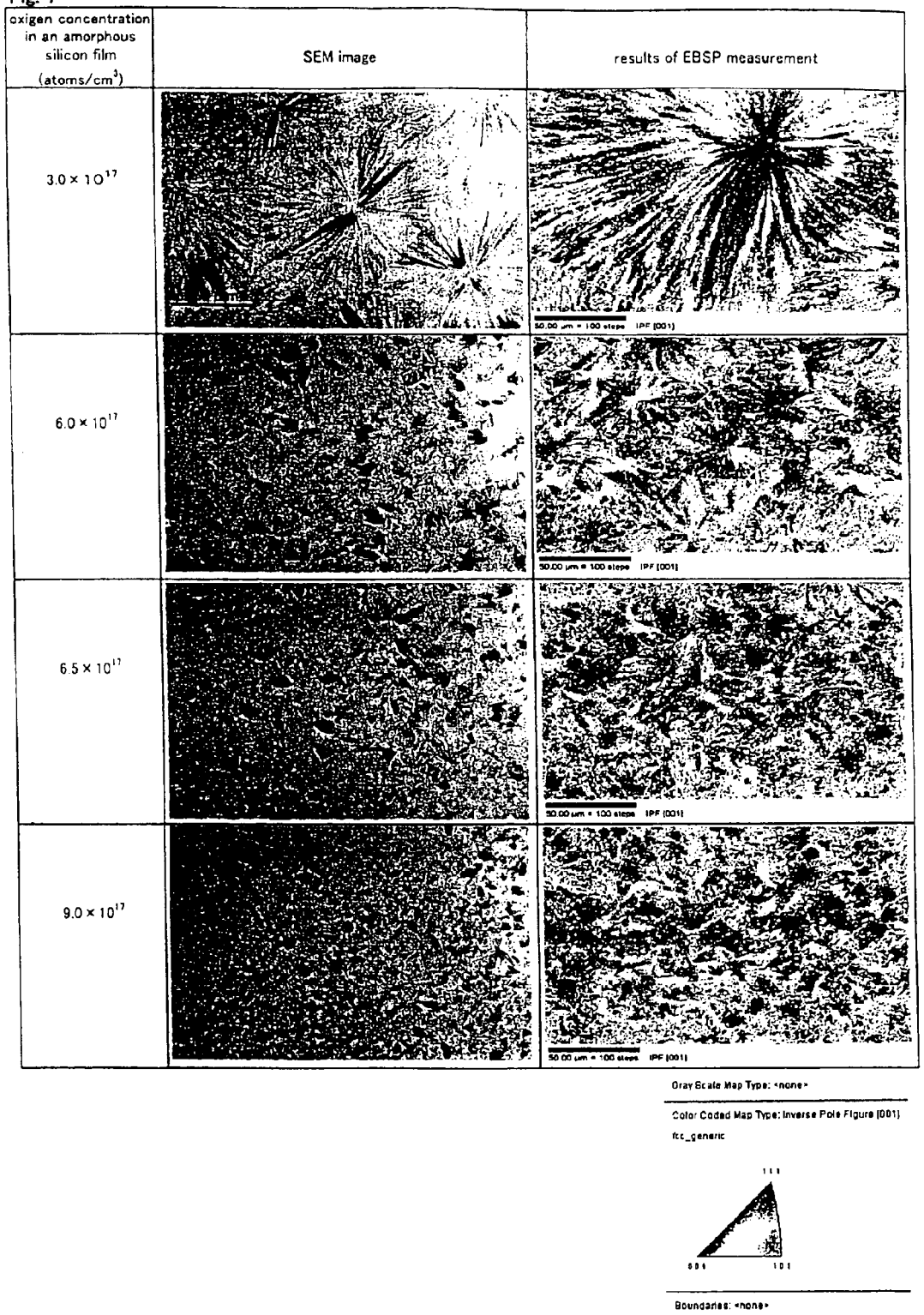

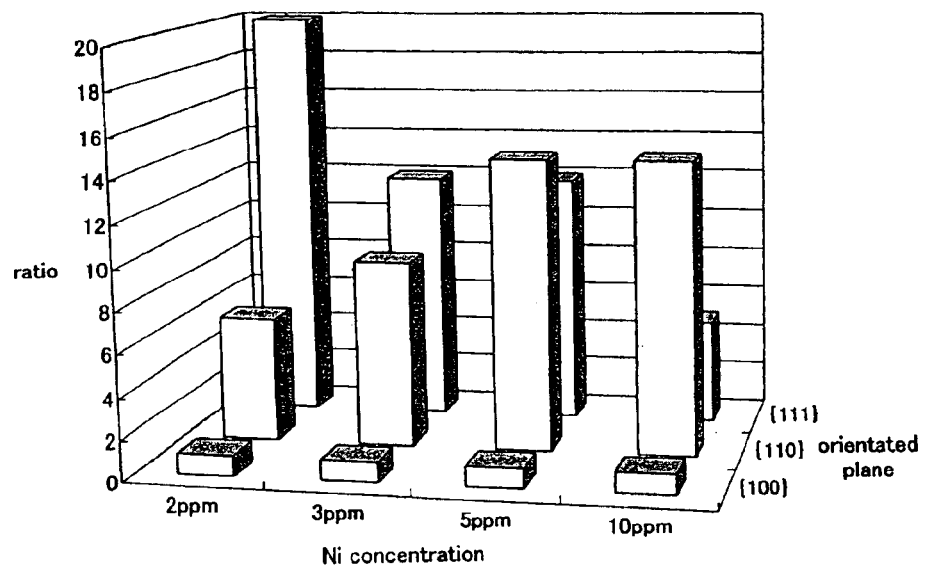

THIN FILM TRANSISTOR AND METHOD OF MANUFACTURING THE SAME

BACKGROUND OF THE INVENTION

1. Field of the Invention

The present invention relates to a thin film transistor and a manufacturing method thereof, and further relates to a semiconductor device provided with a thin film transistor and a manufacturing method thereof. The present invention also relates to a liquid crystal display device, EL display device and other display devices provided with the thin film transistor, and a manufacturing method thereof.

2. Description of the Related Art

Recently, researches on high performance semiconductor devices (specifically, liquid crystal displays, EL display devices and other display devices) using a thin film transistor have been promoted. A thin film transistor (hereinafter referred to as a TFT) with high mobility needs to be realized particularly for a semiconductor device which is required to have high mobility and a high performance. As a method for improving the crystallinity of the semiconductor film, a metal element as typified by Ni which drives crystallinity is doped, formed into a film, or applied on the semiconductor film, and heated thereafter to form a crystalline semiconductor film.

Through the process of crystallization described above, a crystalline semiconductor film with large particle size is obtained, and a semiconductor device, wherein grain boundaries are connected with each other and grain defects are less, is obtained further.

However, metal elements typified by Ni have an adverse effect on device properties of a TFT and consequently; a step for removing the elements (hereinafter referred to as a gettering step) has been carried out. A gettering step is known as a technique in which metal impurity assimilated into a semiconductor segregates to a gettering site (a gettering sink) with some kind of energy, and impurity density at an active device region is reduced.

Gettering steps are divided broadly into two categories, an extrinsic gettering and an intrinsic gettering. The extrinsic gettering provides a gettering effect by applying a strain field or chemical action from the exterior. Meanwhile, the intrinsic gettering utilizes a strain field of a lattice defect caused by oxygen that is generated inside a single crystal silicon wafer.

As a specific example of gettering steps, a gettering is performed by forming an impurity region doped with rare gas elements (rare gas) and segregating a metal element contained in a semiconductor film to the impurity region by heat treatment (refer to Japanese Patent Laid-Open No. 2002-203789, for example). Further, by forming a material with tensile stress at specified elongation or more on a semiconductor over a substrate, an impurity element in the semiconductor is gettered to the material (refer to Japanese Patent Laid-Open No. 2001-223219, for example).

Thus, after passing through various steps typified by a gettering step, a crystalline semiconductor film is obtained.

However, gettering steps as described above have the disadvantage of high cost due to an increase in the number of steps. Also, a manufacturing method of a crystalline semiconductor film, which does not require a gettering step, has been in demand.

SUMMARY OF THE INVENTION

Thereupon, it is an object of the present invention to provide a manufacturing method of a crystalline semiconductor film or a manufacturing method of a TFT, each does not require a gettering step in a crystallization process of a semiconductor film using a metal element typified by Ni.

A further object of the present invention is to provide TFTs manufactured according to the present invention and also a semiconductor device equipped with the TFTs (specifically, display devices such as a liquid crystal display device or an EL display device).

In view of the above-mentioned problem, the inventors of the present invention focus attention on a point of reducing a concentration of a metallic element that promotes (accelerates) crystallization, which is used for a crystallization process (hereinafter indicated as merely a metallic element). In other words, it is considered that a gettering step may be omitted if the crystallization can be made in a state in which the concentration of the metallic element is reduced to a level at which device characteristics of a TFT are not affected.

Therefore, according to the present invention, there is provided a TFT in which a concentration of a metallic element, typically Ni, in a crystalline semiconductor film is lower than $4\times10^{16}$ atoms/cm$^3$. In addition, according to the present invention, it is desirable that a concentration of Ni is specifically $5\times10^{15}$ atoms/cm$^3$ to $3\times10^{16}$ atoms/cm$^3$, preferably, $7\times10^{15}$ atoms/cm$^3$ to $3\times10^{16}$ atoms/cm$^3$. Note that, in the present invention, one or plural kinds of elements selected from the group consisting of nickel (Ni), iron (Fe), cobalt (Co), palladium (Pd), platinum (Pt), copper (Cu), gold (Au), silver (Ag), indium (In), and tin (Sn) can be used as the metallic element.

Further, according to the present invention, when a concentration of oxygen in an amorphous semiconductor film is $5\times10^{19}$ atoms/cm$^3$ to $1\times10^{21}$ atoms/cm$^3$, preferably, $1\times10^{20}$ atoms/cm$^3$ to $6\times10^{20}$ atoms/cm$^3$, crystallization can be made even though the metallic element has a low concentration. Note that, because the concentration of oxygen in an amorphous silicon film does not change before and after the crystallization, it can be expected that the concentration of oxygen in a crystalline silicon film is $5\times10^{19}$ atoms/cm$^3$ to $1\times10^{21}$ atoms/cm$^3$, preferably, $1\times10^{20}$ atoms/cm$^3$ to $6\times10^{20}$ atoms/cm$^3$.

Also, according to the present invention, in order to control the concentration of the metallic element in the crystalline semiconductor film, the concentration of the metallic element provided to the amorphous semiconductor film is controlled. More specifically, for the control, minute quantities of metallic element ions are implanted into the amorphous semiconductor film by ion implantation, the amorphous semiconductor film is heated in a water vapor atmosphere containing the metallic element, or an aqueous solution containing the metallic element is applied onto the amorphous semiconductor film and then cleaning is conducted.

Also, according to the present invention, in order to control the concentration of oxygen in the crystalline semiconductor film, the concentration of oxygen is controlled at the time of formation of the amorphous semiconductor film. More specifically, low pressure CVD (hereinafter indicated as LPCVD) or plasma CVD (hereinafter indicated as PCVD) is used and a gas including minute quantities of oxygen (for example, oxygen gas, oxynitride gas, or water vapor) is contained in raw gas. In addition, a substrate temperature of a film formation apparatus, a film formation pressure, and power of an RF power supply may be controlled.

Also, in a semiconductor film crystallizing process of the present invention, heating, laser light irradiation, magnetic energy application, high output microwave irradiation, or the like, or a combination thereof may be used.

Therefore, according to the present invention, the crystallizing process can be conducted using the metallic element with a low concentration in a state in which the concentration of oxygen in the amorphous semiconductor film is reduced, so that the gettering step can be omitted. Thus, according to the present invention, a preferable crystalline semiconductor film can be formed and TFT having good device characteristics can be provided without conducting the gettering step. Further, a semiconductor device including the TFT (more specifically, a liquid crystal, display device, an EL display device, or other display devices) can be provided.

BRIEF DESCRIPTION OF THE DRAWINGS

The patent or application file contains at least one drawing executed in color. Copies of this patent application publication with color drawing(s) will be provided by the Office upon request and payment of the necessary fee.

FIG. 1 shows an experimental result according to the present invention;

FIG. 2 shows an experimental result according to the present invention;

FIGS. 3A to 3G show manufacturing processes of a thin film transistor according to the present invention;

FIG. 7 shows an experimental result according to the present invention;

FIG. 12 shows an experimental result according to the present invention.

DETAILED DESCRIPTION OF THE PREFERRED EMBODIMENTS

Figure 4A:
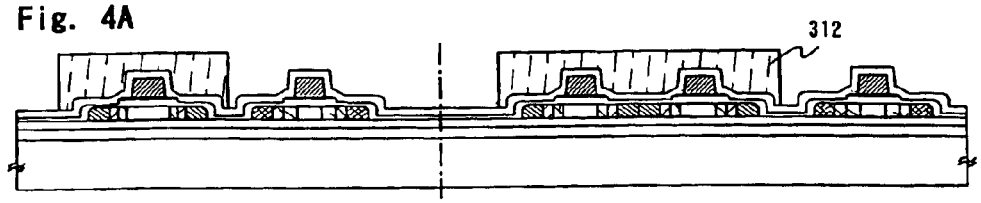
FIGS. 4A to 4D show manufacturing processes of a thin film transistor according to the present invention.

The present invention will be described in detail through the following embodiment modes.

Embodiment Mode 1

In this embodiment mode, a concentration of a metallic element in a crystalline semiconductor film, a concentration of oxygen in an amorphous semiconductor film, and a crystal grain size of a crystalline semiconductor film formed according to the present invention will be described based on experiments.

First, in order to estimate a concentration of the metallic element having a level at which device characteristics of a TFT are not affected, the inventors of the present invention obtained a relationship between Ioff_2 of the TFT and a concentration of Ni in a crystalline silicon-film. FIG. 1 shows the results. Note that the concentration of Ni is measured by an ICP-MS (inductively coupled plasma mass spectrometer) and a range of error is ±5%.

As is apparent from FIG. 1, when the concentration of Ni in the crystalline silicon film is equal to or larger than $4 \times 10^{16}$ atoms/cm$^3$, a value of Ioff_2 is high and a variation is large. However, when the concentration of Ni is $1.6 \times 10^{16}$ atoms/cm$^3$, a value of Ioff_2 becomes smaller. At this time, almost no abnormal point appears and a variation is suppressed.

Therefore, it is considered that, if the semiconductor film can be crystallized in a state in which the concentration of Ni in the crystalline silicon film is lower than $4 \times 10^{16}$ atoms/cm$^3$, a gettering step is unnecessary because the device characteristics of the TFT are not affected.

In other words, when the crystallization is made in a state in which the concentration of the metal element typified by Ni in the crystalline semiconductor film is lower than $4 \times 10^{16}$ atoms/cm$^3$, more specifically, $5 \times 10^{15}$ atoms/cm$^3$ to $3 \times 10^{16}$ atoms/cm$^3$, preferably, $7 \times 10^{15}$ atoms/cm$^3$ to $3 \times 10^{16}$ atoms/cm$^3$, the gettering step may be unnecessary.

Referring to FIG. 12 that shows reference data, a crystal orientation in the case where the semiconductor film is crystallized in a state in which the concentration of Ni is reduced as mentioned above will be described. Note that the reason why the reference data is indicated is as follows. An aqueous solution containing Ni is applied at 2 ppm, 3 ppm, 5 ppm, and 10 ppm onto amorphous silicon films formed by a PCVD method. The amorphous silicon films are heated at 500° C. for 1 hour and then heated at 530° C. for 10 hours to obtain crystalline silicon films. The obtained crystalline silicon films are used as measured samples. The concentrations in those films are slightly different from the concentration in the present invention.

As is apparent from FIG. 12, as the concentration of Ni decreases, a ratio of {110} is reduced and a ratio of {111} is increased. In particular, when the aqueous solution containing Ni is 3 ppm or less, a relationship between the ratio of {110} and the ratio of {111} are reversed and the ratio of {111} becomes about 20%.

Thus, when the crystallization is made in a state in which the concentration of Ni is reduced as in the present invention, it is assumed that the ratio of {111} is high and 20% or more in the structure. In addition, with respect to {111}, values in electron mobility and hole mobility of the TFT are hardly varied. Accordingly, in the crystalline semiconductor film having a high ratio of {111}, the degree of freedom of an alignment of the active layer of a TFT becomes higher.

Also, in order to study crystallization of the semiconductor film by the metal element having a low concentration as described above, a relationship between a concentration of oxygen in the amorphous silicon film and a crystallized grain size is obtained. FIG. 2 shows the results.

As is apparent from FIG. 2, when the concentration of oxygen in the amorphous silicon film is high, the crystal grain is small. With respect to this, it is considered that a frequency (probability) in which NiSi$_2$ (nickel silicide) as crystal nucleus is produced becomes higher as the concentration of oxygen becomes higher, and crystal growths begin from a large number of crystal nuclei.

Also, FIG. 7 shows reference results in which crystal grains are observed by a SEM and an EBSP method. In FIG. 7, amorphous silicon films in which concentrations of oxygen in points plotted in FIG. 2 are $3.0 \times 10^{17}$ atoms/cm$^3$, $6.0 \times 10^{17}$ atoms/cm$^3$, $6.5 \times 10^{17}$ atoms/cm$^3$, and $9.0 \times 10^{17}$ atoms/cm$^3$, respectively, are formed by LPCVD and an aqueous solution containing Ni is applied at 5 ppm thereto. The amorphous silicon films are heated at 450° C. for 1 hour and then heated at 600° C. for 12 hours to form crystalline silicon films as observed samples. At this time, the crystalline silicon films in which grain boundaries and amorphous regions are removed by a secco etching method are observed. Note that the reason why crystallization is made even if the concentration of oxygen is low in this experiment is because the concentration of Ni is a certain high level.

Here, the EBSP method will be described. The EBSP (electron backscatter diffraction pattern) method is a method of analyzing crystal orientations in the plane of the crystalline semiconductor film. According to the method, the crystal orientations of crystal grains in respective measurement points can be displayed by different colors. In addition, a region within a range of a deviation angle of crystal orientation which is set by a measuring person (permissible deviation angle) in a point adjacent to a focused measurement point can be displayed while being separated from another region. While the permissible deviation angle can be freely set by the measuring person, a set value of a general permissible deviation angle is 15°. When a point is focused, a region in which a deviation angle of crystal orientation of a point adjacent to the focused point is within a range of 15° or less is called a domain. Microscopically, the dmain includes a plurality of crystal grains. However, because the permissible deviation angle of crystal orientation is small, the domain can be macroscopically assumed as one crystal grain.

As can be also seen from FIG. 7, an average grain size of grain (crystal grain) becomes smaller as the concentration of oxygen increases.

As is apparent from FIGS. 2 and 7 as described above, when the concentration of oxygen in the amorphous silicon film becomes higher, the crystal grain becomes smaller and a frequency (probability) in which crystal nuclei are produced is increased. In other words, it is considered that crystallization can be more easily made, as the concentration of oxygen in the amorphous silicon film becomes higher.

Note that, when the concentration of oxygen in the amorphous silicon film is too high, (in general, when the concentration of oxygen exceeds $10^{21}$ atoms/cm$^3$), the film becomes a silicon oxide film. Therefore, attention is required.

On the other hand, when the concentration of oxygen is reduced (when the concentration of oxygen is about $5 \times 10^{18}$ atoms/cm$^3$ to $1 \times 10^{19}$ atoms/cm$^3$) in a state in which the concentration of Ni is reduced, preferable crystallinity can not be obtained in a crystallization process in some cases. With respect to this, it is considered that an amorphous silicon film remains because oxygen and Ni are not sufficiently supplied to silicon that serves as a semiconductor film material.

In consideration of the above study, the inventors of the present invention found that, when the concentration of oxygen in the amorphous silicon film is $5 \times 10^{19}$ atoms/cm$^3$ to $1 \times 10^{21}$ atoms/cm$^3$, preferably, $1 \times 10^{20}$ atoms/cm$^3$ to $6 \times 10^{20}$ atoms/cm$^3$, crystallization is made even if the concentration of Ni in the crystalline semiconductor film is less than $4 \times 10^{16}$ atoms/cm$^3$, more specifically, $5 \times 10^{15}$ atoms/cm$^3$ to $3 \times 10^{16}$ atoms/cm$^3$, preferably, $7 \times 10^{15}$ atoms/cm$^3$ to $3 \times 10^{16}$ atoms/cm$^3$.

In other words, the present invention is characterized in that the concentration of oxygen in the amorphous semiconductor film is $5 \times 10^{19}$ atoms/cm to $1 \times 10^{21}$ atoms/cm$^3$, preferably, $1 \times 10^{20}$ atoms/cm$^3$ to $6 \times 10^{20}$ atoms/cm$^3$, and the concentration of the metallic element, typically Ni, in the crystalline semiconductor film is less than $4 \times 10^{16}$ atoms/cm$^3$, more specifically, $5 \times 10^{15}$ atoms/cm$^3$ to $3 \times 10^{16}$ atoms/cm$^3$, preferably, $7 \times 10^{15}$ atoms/cm$^3$ to $3 \times 10^{16}$ atoms/cm$^3$. As a result, in a TFT manufacturing process of the present invention, a gettering step can be omitted, so that the throughput of the process can be improved.

Embodiment Mode 2

In this embodiment mode, a method of manufacturing an active matrix substrate including TFT formed according to the present invention will be described. The active matrix substrate includes a plurality of TFT. Here, the case where the active matrix substrate includes a driver circuit portion which is composed of an n-channel TFT and a p-channel TFT and a pixel portion which is composed of an n-channel TFT will be described.

First, as shown in FIG. 3A, a base insulating film 302 made from a laminate of insulating films (such as a laminate of a silicon oxide film and a silicon nitride film or a laminate of the silicon oxide film and an oxynitride film) is formed on a substrate 301 having an insulating surface by using a sputtering method or a CVD method. A two-layer structure may be used for the base insulating film. Alternatively, a single layer film of the insulating film or a structure in which two layers or more are laminated may be used for the base insulating film. In this embodiment mode, as a first layer of the base insulating film, a silicon oxynitride film 302a is formed at a thickness of 10 nm to 200 nm (preferably, 50 nm to 100 nm) by a plasma CVD method using $SiH_4$, $NH_3$, $N_2O$, and $H_2$ as reactive gases. Here, the silicon oxynitride film having a film thickness of 50 nm is formed. Next, as a second layer of the base insulating film, a silicon oxynitride film 302b is laminated at a thickness of 50 nm to 200 nm (preferably, 100 nm to 150 nm) by a plasma CVD method using $SiH_4$ and $N_2O$ as reactive gases. Here, the silicon oxynitride film having a film thickness of 100 nm is formed.

Next, as shown in FIG. 3B, a semiconductor film is formed on the base insulating film 302. The semiconductor film is an amorphous semiconductor film containing silicon which has an amorphous structure and may be formed by a low pressure CVD (LPCVD) method, a plasma CVD method, or the like. At this time, if the concentration of oxygen in the amorphous semiconductor film can be controlled, any formation method may be used. For example, a gas including minute quantities of oxygen such as oxygen, oxygen dinitride, oxygen nitride, and water vapor may be contained in a raw gas. In addition, in a reaction apparatus, a temperature of a substrate may be set to 200° C. to 280° C., a pressure in a reaction chamber may be set to 0.3 Torr to 2 Torr (39.9 Pa to 266 Pa), and power of an RF power supply may be set to 30 W to 150 W. In this embodiment mode, a mixture gas in which silane ($SiH_4$) and helium (He) are mixed with $N_2O$ is used as a raw gas with a flow rate of 100 sccm of silane and 50 sccm of $N_2O$ and an amorphous silicon film 303 is formed by a PCVD method. A pressure in the reaction chamber is set to 0.45 Torr (59.85 Pa), power of the RF power supply is set to 18 W, and its frequency is set to 13.56 MHz. A temperature of the substrate is kept to 200° C. to 250° C. With such a condition, film formation is conducted.

After that, a metallic element is added to the amorphous silicon film. Here, the addition indicates that the metallic element is made in contact with at least the surface of the amorphous semiconductor film, which is crystallized. For example, a solution containing Ni (including an aqueous solution and an acetate solution) is applied onto the amorphous silicon film by an application method such as spin coating or dipping. If necessary, cleaning is conducted. Then, a film containing Ni is formed (note that the film is too thin to be observed as a film in some cases). At this time, in order to improve wettability of the surface of the amorphous semiconductor film to distribute an aqueous solution on the entire surface of the amorphous silicon film, it is desirable that an oxide film is formed at 10 angstroms to 50 angstroms by UV light irradiation in an oxygen atmosphere, a thermal oxidation method, processing using ozone water containing hydroxy radical, processing using hydrogen peroxide, or the like. In addition, it is preferable that Ni ions are implanted into the amorphous silicon film by an ion implantation method, heating is conducted in a water vapor atmosphere containing Ni, or sputtering is conducted in Ar plasma using an Ni material as a target. In other words, any method may be used if the concentration of Ni when the amorphous silicon film becomes a crystalline silicon film can be controlled. In this embodiment mode, a thin oxide film is formed on the amorphous silicon film using ozone water and an aqueous solution containing Ni at 0.5 ppm to 5 ppm is applied thereon by a spin coating method. After that, washing is conducted to remove excess amounts of Ni adhered to the oxide film. Thus, the amount of Ni to be added is set to a preferable value (about 0.05 ppm or less, more specifically, 0.01 ppm to 0.05 ppm) to form an Ni aqueous solution film 304 (note that the film is too thin to be observed as a film).

After that, heat treatment is conducted at 500° C. to 550° C. for 8 hours to 20 hours to crystallize the amorphous silicon film. At this time, it is preferable that crystallization is made while a heating temperature is changed. Because hydrogen and the like in the amorphous silicon film are released by a first heating step, film roughness at the time of crystallization can be reduced. In addition, a magnetic field may be applied to make crystallization with magnetic energy. Alternatively, a high output microwave may be used. In this embodiment mode, heat treatment is conducted at 500° C. for 1 hour, and then heat treatment is conducted at 550° C. for 4 hours.

Then, it is preferable that laser light irradiation is further conducted to promote crystallization. In addition, with respect to laser light, an excimer laser, a YAG laser, or a $YVO_4$ laser, which are a pulse oscillation type or a continuous light emitting type, can be used. When these lasers are used, a method of linearly condensing laser light emitted from a laser oscillator by an optical system and irradiating the semiconductor film with the resultant light may be used. A crystallization condition is determined accordingly by an operator. When the excimer layer is used, a pulse oscillation frequency is set to 30 Hz and a laser energy density is set to 200 mJ/cm² to 600 mJ/cm² (typically, 400 mJ/cm² to 550 mJ/cm²). When the YAG laser is used, it is preferable that its second harmonic is used, a pulse oscillation frequency is set to 1 kHz to 10 kHz, and a laser energy density is set to 300 mJ/cm² to 600 mJ/cm² (typically, 350 mJ/cm² to 500 mJ/cm²). The entire surface of the substrate is irradiated with laser light that is linearly condensed with a width of 100ì m to 1000ì m, for example, 400ì m. At this time, an overlap ratio of the linear laser light may be set to 50% to 98%. In addition, it is preferable that the substrate is scanned with a state in which it is floated and the entire surface of the crystalline silicon film is irradiated with laser light. In this embodiment mode, a pulse oscillation type excimer laser is used and the crystalline silicon film is irradiated with laser light having 30 Hz and 470 mJ/cm² to 520 mJ/cm² to promote crystallization.

Then, boron is added to the crystalline silicon film (this is called a channel dope). Here, boron is not necessarily added. However, the addition can be suitably used to keep the threshold voltage of an n-channel TFT in a predetermined range.

After that, as shown in FIG. 3C, the crystalline silicon film is patterned in a desirable shape to form island-like semiconductor films 305. The thickness of the semiconductor films is 25 nm to 80 nm (preferably, 30 nm to 60 nm).

Next, as shown in FIG. 3D, the surfaces of the semiconductor layers are cleaned using an etchant containing hydrofluoric acid and a gate insulating film 306 covering the semiconductor layers is formed. The gate insulating film 306 is formed from an insulating film containing silicon at a thickness of 40 nm to 150 nm by a plasma CVD method or a sputtering method. In this embodiment mode, a silicon oxynitride film (composition ratio: Si=32%, O=59%, N=7%, and H=2%) is formed at a thickness of 115 nm by the plasma CVD method. Of course, the gate insulating film is not limited to the silicon oxynitride film, and other insulating films containing silicon may be used as a single layer or a laminate structure.

Next, as shown in FIG. 3E, a first conductive film having a film thickness of 20 nm to 100 nm and a second conductive film having a film thickness of 100 nm to 400 nm are laminated on the gate insulating film. The first conductive film and the second conductive film each may be formed of an element selected from Ta, W, Ti, Mo, Al, and Cu, or an alloy material or a compound material that mainly include the above-mentioned element. In addition, for the first conductive film and the second conductive film, a semiconductor film which is typified by a polycrystalline silicon film doped with an impurity element such as phosphorus, or an AgPdCu alloy may be used. Further, the present invention is not limited to a two-layer structure. A three-layer structure may be used in which, for example, a tungsten film having a film thickness of 50 nm, an aluminum-silicon alloy (Al—Si) film having a film thickness of 500 nm, a titanium nitride film having a film thickness of 30 nm are laminated in order. When the three-layer structure is used, a tungsten nitride film may be used instead of the tungsten film as a first conductive film, an aluminum-titanium alloy (Al—Ti) film may be used instead of the aluminum-silicon alloy (Al—Si) film as a second conductive film, and a titanium film may be used instead of the titanium nitride film as a third conductive film. A single layer structure may also be used. In this embodiment mode, a tantalum nitride film 307 having a film thickness of 50 nm and a tungsten film 308 having a film thickness of 370 nm are laminated in order on the gate insulating film 306.

After that, patterning is conducted according to the following manner to form respective gate electrodes and respective wirings. An ICP (inductively coupled plasma) etching method is used. When etching conditions (the amount of power applied to a coil type electrode, the amount of power applied to an electrode on the substrate side, a temperature of the electrode on the substrate side, and the like) are controlled as appropriate, the first conductive film and the second conductive film can be etched in a desirable taper shape. Note that a chlorine system gas typified by $Cl_2$, $BCl_3$, $SiCl_4$, $CCl_4$, and the like, a fluorine system gas typified by $CF_4$, $SF_6$, $NF_3$, or the like, or $O_2$ can be suitably used as an etching gas. In this embodiment mode, a mask made of resist is formed, and then first etching and second etching are conducted.

With respect to first etching conditions, $CF_4$, $Cl_2$, and $O_2$ are used as etching gases and a ratio of respective gas-flow rates is set to 25/25/10 sccm. RF power having 700 W and 13.56 MHz is supplied to a coil type electrode at a pressure of 1 Pa and RF power having 150 W and 13.56 MHz is supplied to a substrate side (sample stage) to apply a substantially negative self bias voltage. Only the W film is etched under the first etching conditions, so that end portions thereof become taper shapes with an angle of 15° to 45°.

After that, second etching is conducted without removing the mask made of resist. With respect to second etching conditions, $CF_4$ and $Cl_2$ are used as etching gases and a ratio of respective gas flow rates is set to 30/30 sccm. RF power having 500 W and 13.56 MHz is supplied to the coil type electrode at a pressure of 1 Pa and RF power having 20 W and 13.56 MHz is supplied to the substrate side (sample stage) to apply a substantially negative self bias voltage. Under the second etching conditions, both the W film and TaN film are etched to the same degree.

Next, first doping processing is conducted without removing the mask made of resist to add an impurity element for imparting a conductivity type to the semiconductor films using the gate electrodes as masks. The first doping processing may be conducted by an ion doping method or an ion implantation method. As the impurity element for imparting an n-type, typically, phosphorus (P) or arsenic (As) is used. First impurity regions ($n^+$ regions) 309 are formed in a self alignment (see FIG. 3F). The impurity element for imparting the n-type is added to the first impurity regions at a concentration range of $1\times10^{20}/cm^3$ to $1\times10^{21}/cm^3$.

Next, third etching is conducted without removing the mask made of resist. Here, with respect to third etching conditions, $CF_4$ and $Cl_2$ are used as etching gases and a ratio of respective gas flow rates is set to 30/30 sccm. RF power having 500 W and 13.56 MHz is supplied to the coil type electrode at a pressure of 1 Pa and RF power having 20 W and 13.56 MHz is supplied to the substrate side (sample stage) to apply a substantially negative self bias voltage.

After that, fourth etching is conducted without removing the mask made of resist. With respect to fourth etching conditions, $CF_4$, $Cl_2$, and $O_2$ are used as etching gases and a ratio of respective gas flow rates is set to 20/20/20 sccm. RF power having 500 W and 13.56 MHz is supplied to the coil type electrode at a pressure of 1 Pa and RF power having 20 W and 13.56 MHz is supplied to the substrate side (sample stage) to apply a substantially negative self bias voltage. According to the third etching and the fourth etching, the W film and the TaN film are anisotropically etched. In addition, when oxygen is contained in the etching gases, the etching rate of the W film and that of the TaN film are made different from each other. The etching rate of the W film is set to be higher than that of the TaN film. Then, as shown in FIG. 3G, the gate insulating film that is not covered with the first conductive film is etched and becomes thinner. At this stage, each gate electrode is formed in which a first conductive layer (TaN film) 307' is used as a lower layer and a second conductive layer (W film) 308' is used as an upper layer.

Next, second doping processing is conducted without removing the mask made of resist to add an impurity element for imparting a conductivity type to the semiconductor films using the gate electrodes as masks. The second doping processing may be conducted by an ion doping method or an ion implantation method. In this embodiment mode, the ion doping method is used. A flow rate of a gas in which phosphine ($PH_3$) is diluted with hydrogen at 5% is set to 30 sccm, a dose is set to $1.5\times10^{14}$ atoms/$cm^2$, and an accelerating voltage is set to 90 keV. The mask made of resist and the second conductive layer become masks. According to the second doping processing, second impurity regions ($n^-$ regions) 310 which are not overlapped with each gate electrode and third impurity regions ($n^-$ regions) 311 which are overlapped with a portion of each gate electrode. The impurity element for imparting the n-type is added to the second impurity regions 310 at a concentration range of $1\times10^{16}/cm^3$ to $1\times10^{17}/cm^3$.

Next, as shown in FIG. 4A, the mask made of resist is removed, and then a new mask 312 made of resist is formed and third doping processing is conducted. According to the third doping processing, the third impurity regions, fourth impurity regions, and fifth impurity regions, to which the impurity element for imparting the conductivity type of the p-type (such as boron) are added, are formed in semiconductor layers composing p-channel TFTs. A condition is set as appropriate such that the impurity element for imparting the p-type is added to the third impurity regions at a concentration range of $1\times10^{20}/cm^3$ to $1\times10^{21}/cm^3$. Note that the third impurity region is the region ($n^+$ region) to which phosphorus (P) is added in the preceding step. However, because the concentration of the impurity element for imparting the p-type, which is added, is 1.5 times to 3 times higher than that of phosphorus, the conductivity type becomes the p-type. Here, regions having the same concentration range as the third impurity regions are also called $p^{30}$ regions.

Also, the fourth impurity regions are regions formed in areas that are not overlapped with taper portions of the second conductive layer A condition is set as appropriate such that the impurity element for imparting the p-type is added to the four impurity regions at a concentration range of $1\times10^{18}/cm^3$ to $1\times10^{20}/cm^3$. The fourth impurity region is also the region ($n^-$ region) to which phosphorus (P) is added in the preceding step. However, because the concentration of the impurity element for imparting the p-type, which is added, is 1.5 times to 3 times higher than that of phosphorus, the conductivity type becomes the p-type. Here, regions having the same concentration range as the fourth impurity regions are also called $p^-$regions.

Also, the fifth impurity region is the region ($n^-$ region) to which phosphorus (P) is added in the preceding step. However, because the concentration of the impurity element for imparting the p-type, which is added, is 1.5 times to 3 times higher than that of phosphorus, the conductivity type becomes the p-type. Here, the fifth impurity regions overlapped with the taper portions of the second conductive layer are also called $p^-$ regions.

According to the above steps, the impurity regions each having the conductivity type of the n-type or the p-type are formed in the respective semiconductor layers.

After the formation of the impurity regions, heat treatment, intense light irradiation, or laser light irradiation is conducted in order to activate the impurity element. In addition to the activation, plasma damage to the gate insulating film and plasma damage to an interface between the gate insulating film and the semiconductor layers can be recovered. In particular, the impurity element is activated from the front surface or the rear surface using an excimer laser in an atmosphere at a room temperature to 300° C. A YAG laser is a preferable activation unit because of easy maintenance. Accordingly, in this embodiment mode, the irradiation of a second harmonic of the YAG laser is conducted for activation.

Figure 4B:
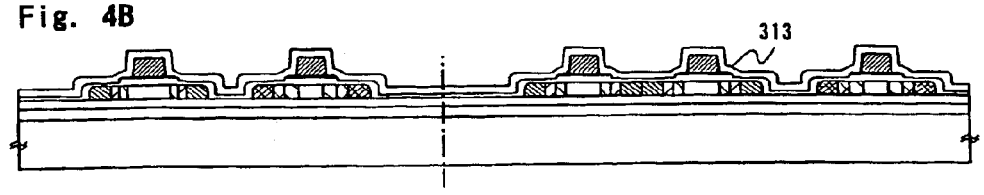

Next, as shown in FIG. 4B, a passivation film made from an insulating film such as a silicon oxynitirde film or a silicon oxide film is formed. In this embodiment mode, a silicon oxynitirde film 313 is formed at a thickness of 100 nm using a plasma CVD method. After that, heating is conducted at 300° C. to 550° C for 1 hour to 12 hours using a clean oven to hydrogenate the semiconductor films. In this embodiment mode, heating is conducted in a nitrogen atmosphere at 410° C. for 1 hour. According to this step, dangling bonds in the semiconductor layers can be terminated by hydrogen contained in a first passivation film 313. In addition, the above-mentioned activation processing of the impurity regions can be conducted simultaneously with the hydrogenation.

Figure 4C:
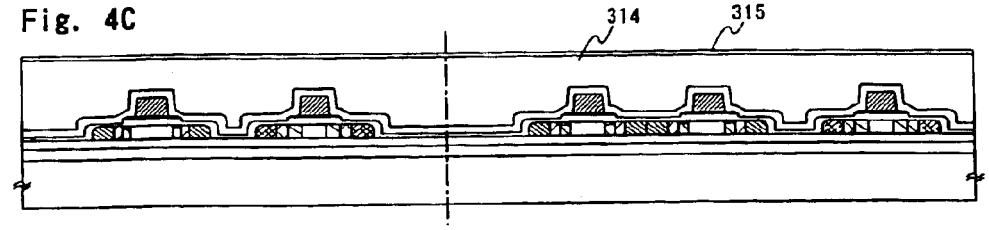

After that, as shown in FIG. 4C, a first interlayer insulating film made of an organic insulator material is formed on the first passivation film. A positive type photosensitive organic resin or a negative type photosensitive organic resin can be used as the organic insulator material. Note that, in the case where the photosensitive organic resin is used for the first interlayer insulating film, if the photosensitive organic resin is etched by exposure processing in a photolithography step, a first opening portion having a curvature can be formed. When the positive type photosensitive organic resin is used for the first interlayer insulating film, it is necessary to conduct decolorization processing for the photosensitive organic resin after etching because the positive type photosensitive organic resin is colored with brown. In this embodiment mode, a photosensitive acrylic resin film having a thickness of 1.05ì m is formed as a first interlayer insulating film 314. After that, a second passivation film 315 made from a nitride insulating film (typically, a silicon nitride film or a silicon nitric oxide film) is formed on the first interlayer insulating film 314. With respect to film formation conditions, a silicon target may be used in a sputtering method using high frequency discharge, and a nitrogen gas may be used as a sputtering gas. A pressure may be set as appropriate, within 0.5 Pa to 1.0 Pa. Discharge power may be within 25 kW to 3.5 kW. A film formation temperature may be within a room temperature (25° C.) to 250° C. When the second passivation film 315 made from the nitride insulating film is formed, degassing produced from the first interlayer insulating film can be suppressed.

Figure 4D:
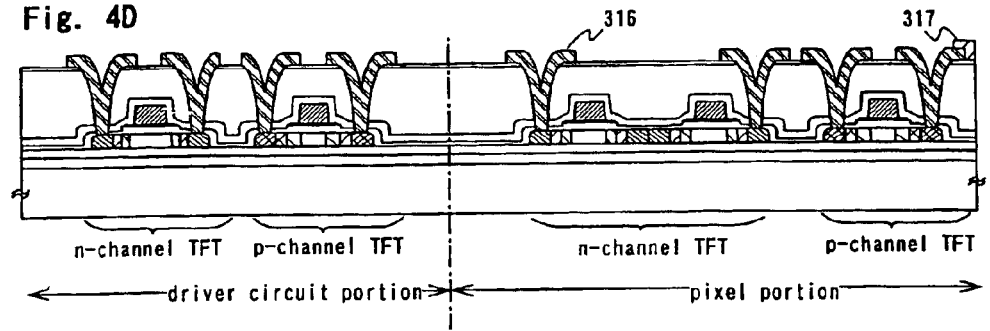

Next, as shown in FIG. 4D, the second passivation film 315, the first interlayer insulating film 314, the first passivation film 313, and the gate insulating film 306 are etched in order, thereby forming opening portions each having a curvature (gradual inner wall). When such opening portions each having a curvature are formed, there is an effect that coverage of electrodes to be formed later is improved. At this time, etching processing may be dry etching processing or wet etching processing. In this embodiment mode, the second passivation film 315 and the first interlayer insulating film 314 are etched by dry etching using a mixture gas of $CF_4$, $O_2$ and $H_2$ to form opening portions. Next, in the same processing apparatus, the first passivation film 313 and the gate insulating film 306 are etched by dry etching using a mixture gas of $CHF_3$ and Ar to form opening portions.

Next, a metallic film is formed in the opening portions and etched, thereby forming source electrodes, drain electrodes, and respective wirings (not shown). A film made of an element such as aluminum (Al), titanium (Ti), molybdenum (Mo), tungsten (W), or silicon (Si), or an alloy film made of those elements may be used as the metallic film. In this embodiment mode, a titanium film, a titanium-aluminum alloy film, and a titanium film (Ti/Al—Si/Ti) are laminated at 100 nm, 350 nm, and 100 nm, respectively, and then patterned in a desirable shape and etched, thereby forming source electrodes, drain electrodes 316, and respective wirings (not shown).

After that, an electrode (which becomes an anode or a cathode in the case of an EL display device and becomes a pixel electrode in the case of a liquid crystal display device) is formed. A transparent conductive film made of ITO, $SnO_2$, or the like can be used for the electrode. In the case of a reflection liquid crystal display device, a metallic film made of Al or the like can be used for the electrode. In this embodiment mode, an ITO film is formed at a thickness of 100 nm and etched in a desirable shape, thereby forming an electrode 317.

According to the above-mentioned steps, an active matrix substrate including TFTs is completed.

In this way, according to the present invention, an active matrix substrate including TFTs which have a preferable crystalline semiconductor film and good device characteristics without conducting a gettering step can be provided.

Embodiment Mode 3

In this embodiment mode, which is different from Embodiment Mode 2, a method of manufacturing an active matrix substrate formed on a quartz substrate that is relatively resistant to a high temperature will be described. Here, as in Embodiment Mode 2, a driver circuit portion including an n-channel TFT and a p-channel TFT and a pixel portion including an n-channel TFT will be described. Note that semiconductor films and respective electrodes may be formed of materials selected from the materials described in Embodiment Mode 2.

Figure 8A:
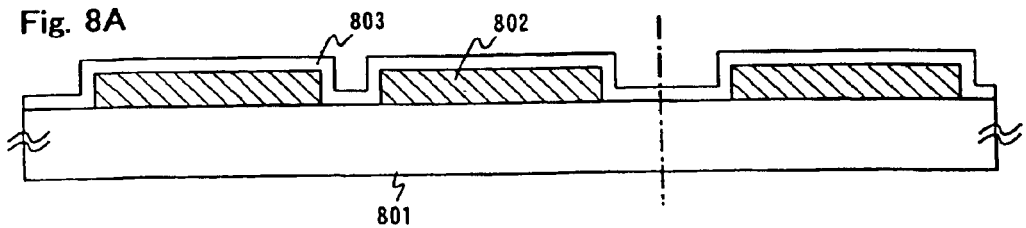
FIGS. 8A to 8E show manufacturing processes of a thin film transistor according to the present invention.

First, as shown in FIG. 8A, an amorphous silicon film 802 is formed on a quartz substrate 801. Because an impurity such as alkali metal that adversely affects operations of TFT is not mixed in the quarts substrate, a base film that prevents the impurity from entering into the TFTs is not necessarily provided. Then, the amorphous silicon film is formed on the quartz substrate 801 using any one of the methods described in Embodiment Mode 2. In this embodiment mode, the amorphous silicon film is formed by an LPCVD method using disilane ($Si_2H_6$) (flow rate is 250 sccm) and helium (He) (flow rate is 350 sccm) as raw gases. At this time, in order to control the concentration of oxygen in the amorphous silicon film, He is mixed with $N_2O$ at 10 ppm to 1000 ppm. A pressure in the reaction chamber is set to 0.5 Torr (66.5 Pa) and a reactive temperature is kept to 430° C. to 460° C. With such a condition, film formation is conducted.

Next, the addition (including application, film formation, and implantation) of a metallic element to the amorphous silicon film is conducted using any one of the methods described in Embodiment Mode 2. In this embodiment mode, Ni is added to the amorphous silicon film by ion implantation using $NiCl_2$ (nickel chloride) as an ion raw material. At this time, steam of $NiCl_2$ evaporated by heating is introduced to the substrate in a film formation chamber. Further, when a material that is hard to vapor-deposit is used, it is preferable that a negative voltage is applied to the material and atoms produced by collision are ionized. Further, in this embodiment mode, in order to control the concentration of Ni in the amorphous silicon film, implantation energy is set to 5 keV and an implantation dose is set to $1\times10^{12}$ atoms/cm$^2$ to $1\times10^{13}$ atoms/cm$^2$.

After that, heattreatment is conducted at 450° C. for 1 hour to move a gas such as hydrogen in the amorphous silicon film, and then heat treatment is conducted at 600° C. for 8 hours to form a crystalline silicon film. Note that, if necessary, laser light irradiation may be conducted to promote crystallization.

Next, a gate insulating film 803 is formed by thermal oxidation and the crystalline silicon film is patterned in a desirable shape. Then, boron is added to the crystalline silicon film (channel doping).

Figure 8B:
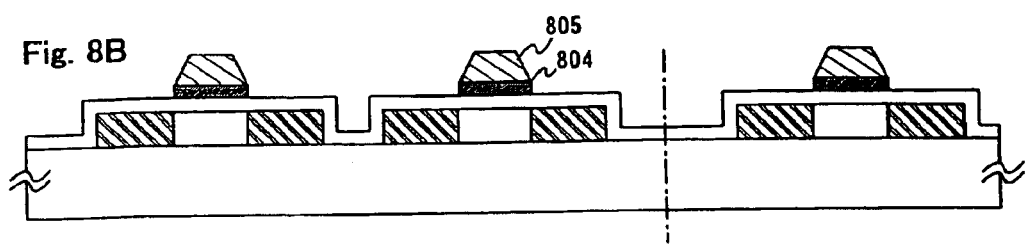

After that, as shown in FIG. 8B, gate electrodes are formed on the gate insulating film. In this embodiment mode, each of the gate electrodes is composed of a tantalum nitride (TaN) layer 804 and a tantalum layer 805, which are laminated.

Then, a mask made from a silicon oxide film is formed, opening portions are formed on impurity regions, and an impurity element such as phosphorus or boron is added, thereby forming source regions and drain regions. Note that a method of forming the source regions and the drain regions may be known by reference to Embodiment Mode 2 and low concentration impurity regions overlapped with the gate electrodes may be provided as appropriate.

After that, activation to the impurity regions is conducted in a nitrogen atmosphere at 800° C. for 1 hour. In this embodiment mode, the activation can be conducted at a high temperature of 800° C. because the quartz substrate is used.

Figure 8C:
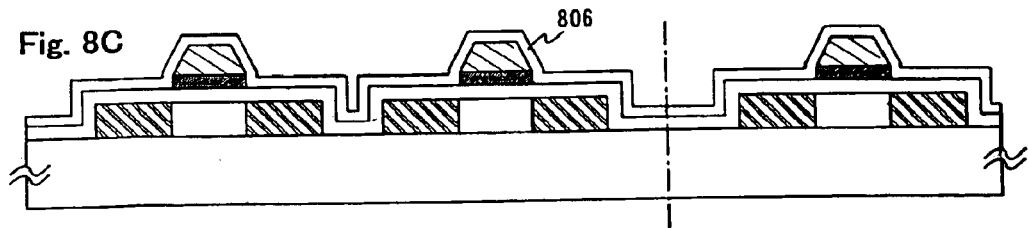
Figure 8D:
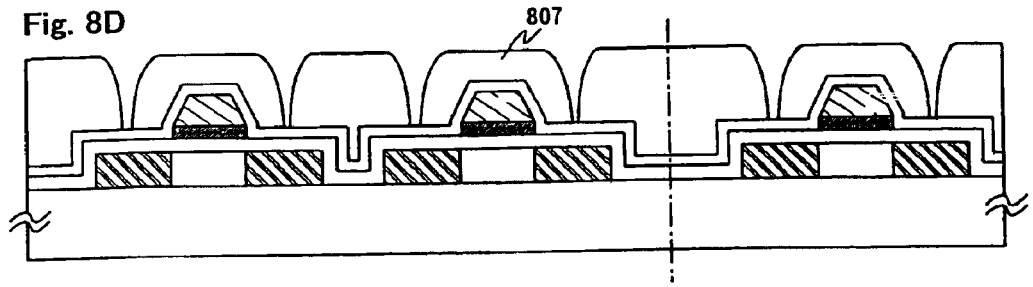

Next, as shown in FIG. 8C, a passivation film 806 made of silicon nitride is formed and hydrogenation of the semiconductor films is conducted. Then, as shown in FIG. 8D, a first interlayer insulating film 807 made of an acrylic resin material is formed on the passivation film. Opening portions in which wirings connected with the source regions and the drain regions are to be formed are formed in the first interlayer insulating film. Source wirings and drain wirings 808, in which a titanium (Ti) film, an aluminum-silicon alloy (Al—Si) film,, arid a titanium (Ti) film are laminated, are formed in the opening portions.

Figure 8E:
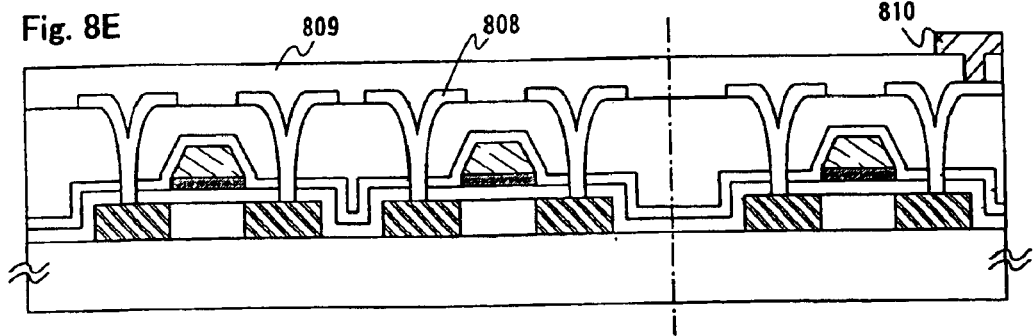

After that, as shown in FIG. 8E, a second interlayer insulating film 809 is made of an acrylic resin material and an electrode 810 (which becomes an anode or a cathode in the case of an EL display device and becomes a pixel electrode in the case of a liquid crystal display device) is formed.

According to the above-mentioned steps, an active matrix substrate including TFTs is completed.

In this way, according to the present invention, an active matrix substrate including TFTs which have a preferable crystalline semiconductor film and good device characteristics without conducting a gettering step can be provided.

Embodiment Mode 4

In this embodiment mode, referring to FIGS. 5A and 5B, an example will be described in which a light emitting element is provided in the active matrix substrate formed in the way as described in Embodiment Mode 2 or 3 to produce an EL display device (EL display module).

First, when the electrode 317 or 810 as described in Embodiment Mode 1 or 2 becomes an anode of the EL display device, the electrode is made of metal (Pt, Cr, W, Ni, Zn, Sn, or In) having a large work function. In this embodiment mode, the electrode is made of ITO having a large work function and etched in a desirable shape.

Figure 5A:
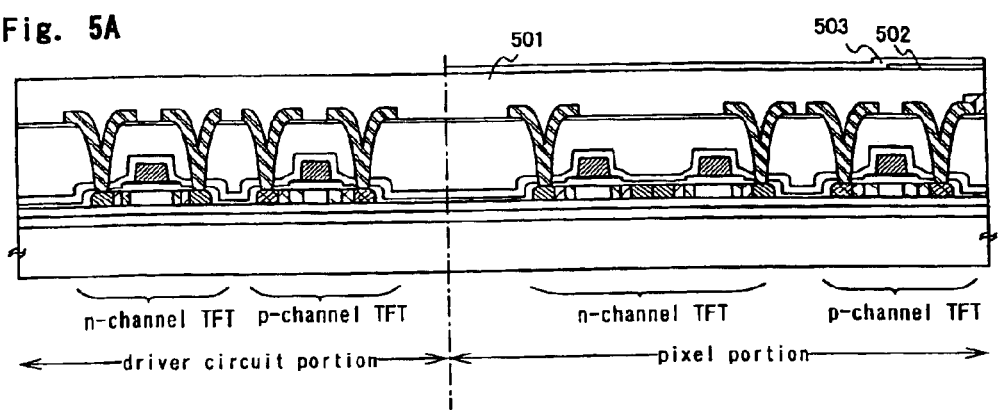
FIGS. 5A and 5B show manufacturing processes of an EL display device according to the present invention.
Figure 5B:
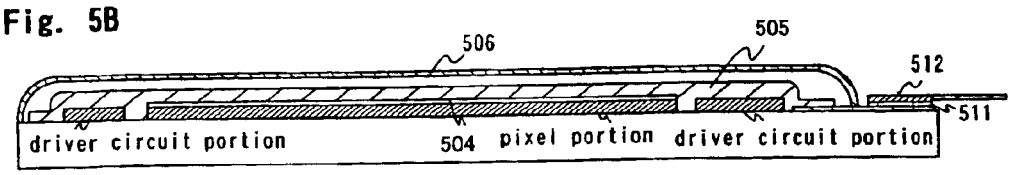

Next, as shown in FIG. 5A, an insulator (which is called a bank, an isolation wall, a partition wall, an embankment, or the like) 501 covering end portions of the electrode 317 or 810 is formed. The insulator 501 may be made of a photosensitive organic resin. For example, when negative type photosensitive acrylic is used as a material of the insulator, the insulator 501 having a curved surface with a first curvature radius in an upper end portion thereof and a curved surface with a second curvature radius in a lower end portion thereof can be formed. It is preferable that the first curvature radius and the second curvature radius are set to 0.2ì m to 3ì m. In addition, the insulator 501 may be covered with a second protective film made from an aluminum nitride film, an aluminum nitric oxide film, or a silicon nitride film. In this embodiment mode, positive type photosensitive acrylic is used as a material of the insulator 501. Further, the insulator 501 is covered with the second protective film (not shown) made from an aluminum nitride film, an aluminum nitric oxide film, or a silicon nitride film.

After that, wiping is conducted using a PVA (polyvinyl alcohol) base porous material to remove contaminants and the like. In this embodiment mode, dusts (contaminants) caused at a time when the ITO film and the insulating films are etched can be removed by conducting wiping using bellclean.

Next, in processing before vapor deposition of a light emitting layer (layer containing organic compounds), PEDOT may be applied onto the entire surface and baking may be conducted. At this time, it is preferable that after the PEDOT is applied, washing is conducted and the PEDOT is applied again because the PEDOT has low wettability with ITO. After that, heating is conducted in a low pressure atmosphere. In this embodiment mode, after the application of the PEDOT, heating is conducted at 170° C. for 30 minutes in a low pressure atmosphere, followed by natural cooling for 30 minutes.

Then, by using vapor deposition apparatus, vapor deposition is conducted while a vapor deposition source is moved. For example, vapor deposition is conducted in a film formation chamber which is evacuated up to the degree of vacuum of $5 \times 10^{-3}$ Torr (0.665 Pa) or less, preferably, $10^{-4}$ Torr to $10^{-6}$ Torr. In the vapor deposition, the organic compounds are vaporized in advance by resistance heating. At vapor deposition, a shutter is open so that the vaporized organic compounds are scattered toward the substrate. The vaporized organic compounds are scattered upward and vapor-deposited onto the substrate through opening portions provided in a metallic mask, thereby forming a light emitting layer 502 (including a hole transporting layer, a hole injecting layer, an electron transporting layer, and an electron injecting layer).

Next, a second electrode 503 is formed as a cathode on the above-mentioned light emitting layer. The second electrode 503 may be made from a thin film containing metal (Li, Mg, or Cs) with a small work function. In addition, it is preferable that the second electrode is made from a laminate film in which a transparent conductive film (ITO (alloy of indium oxide and tin oxide), alloy of indium oxide and zinc oxide ($In_2O_3$—ZnO), zinc oxide (ZnO), or the like) is laminated on the thin film containing Li, Mg, Cs, or the like. Further, in order to reduce a resistance of the cathode, an auxiliary electrode may be provided on the insulator 501.

Here, the example in which the light emitting layer 502 is formed by a vapor deposition method is indicated. However, the present invention is not particularly limited to this example. A light emitting layer made of a polymer may be provided by an application method (spin coating method, inkjet method, or the like). In addition, in this embodiment mode, the example is indicated in which the layer made of a low molecular material is laminated as the organic compound layer is indicated. However, a layer made of a polymer material and a layer made of a low molecular material may be laminated. In addition, RGB light emitting layers may be formed to achieve full color display, or, in the case of forming a monochrome light emitting layer, full color display may be achieved by using a color conversion layer or a color filter.

Note that, with respect to an EL display device, two structures are considered according to a light emitting direction. One is a structure in which light emitted from a light emitting element passes through the second electrode 503 and is incident into an eye of an observer. This is the case where the structure is used in which the light emitted from the light emitting element passes through the second electrode and is incident into the eye of the observer. The other is a structure in which the light emitted from the light emitting element passes through the electrode 317 or 810 and through the substrate and is incident into the eye of the observer. When a structure in which light emitted from the light emitting element passes through a first electrode and is incident into the eye of the observer is used, it is desirable to use a translucent material for the electrode 317 or 810.

After forming the second electrode 503 according to the above-mentioned steps, the next steps are, as shown in the entire view of an EL display device in FIG. 5B, as follows: a silicon nitride film is provided as a first protective film 504; a resin film made of a ultraviolet curable resin, an epoxy resin, or the like is provided as a second protective film 505; and a plastic film is provided as a cover material 506 thereon. Note that, it is desirable that the surface of the plastic film is covered with an inorganic insulating film such as a silicon nitride film to prevent moisture and oxygen from passing therethrough. After that, a FPC (flexible printed circuit) 512 is connected with an external terminal through an anisotropic conductive film 511, thereby completing the EL display device (EL display module).

Thus, according to the present invention, the gettering step can be omitted, throughput of the EL display device manufacturing process can be improved, and a cost call be reduced.

Embodiment Mode 5

Figure 6A:
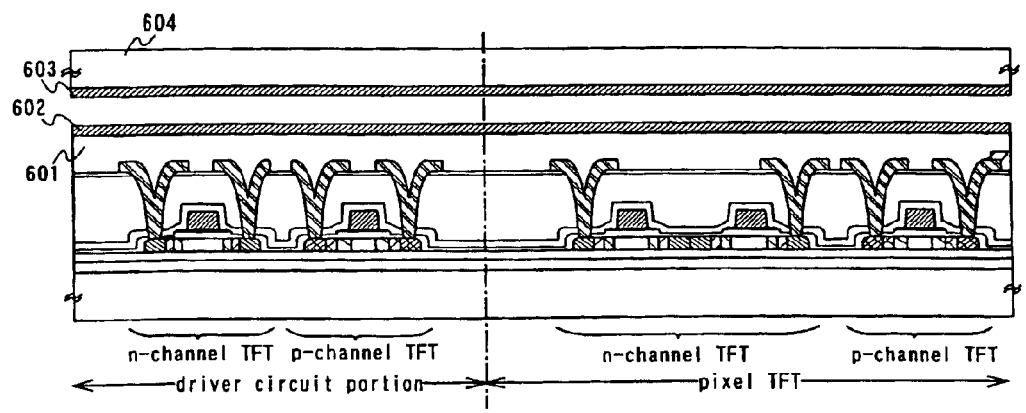
FIGS. 6A and 6B show a manufacturing process of a liquid crystal display device according to the present invention.
Figure 6B:
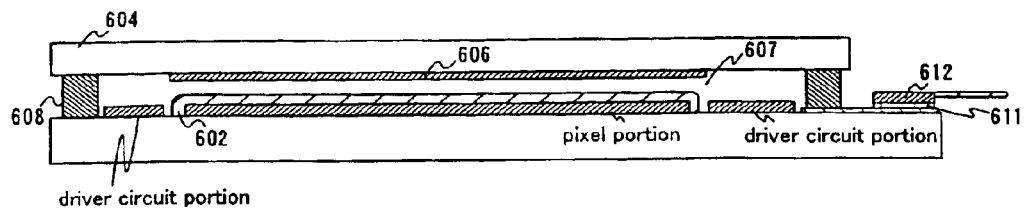

In this embodiment mode, referring to FIGS. 6A and 6B, an example will be described in which a liquid crystal element is provided in the active matrix substrate formed in the way as described in Embodiment Mode 2 or 3, thereby producing a liquid crystal display device (liquid crystal display module).

First, the electrode 317 or 810 as described in Embodiment Mode 2 or 3 is made of ITO to be used as a pixel electrode of a transmission liquid crystal display device. Note that, in the case of a reflection liquid crystal display device, the pixel electrode may be made from a metallic film made of Al or the like. After that, as shown in FIG. 6A, a flattening film 601 is made of an organic material. At this time, the flattening film may be made of an inorganic material and flattened by CMP or the like.

After that, an alignment fill 602 is provided on the active matrix substrate. An opposite electrode 603 is provided in an opposite substrate 604 prepared in advance. As shown in FIG. 6B, the opposite substrate and the active matrix substrate are bonded to each other by a sealing member 608 and then a liquid crystal 607 is injected therebetween, thereby producing a liquid crystal cell. Note that the liquid crystal element is an element that controls light transmission or non-light transmission according to an optical modulation action of the liquid crystal. The liquid crystal element is composed of a pair of electrodes and the liquid crystal interposed therebetween. Further, a FPC (flexible printed circuit) 612 may be bonded through an anisotropic conductive film 611 to compose an external terminal.

Thus, according to the present invention, the gettering step can be omitted, throughput of the liquid crystal display device manufacturing process can be improved, and a cost can be reduced.

Embodiments

Embodiment 1

The following are examples of electrical appliances having a light emitting element or a liquid crystal element each provided with a TFT formed according to the present invention: video cameras, digital cameras, navigation systems, audio players (car audios, audio components, etc.), notebook type personal computers, game machines, portable information terminals (mobile computers, mobile telephones, mobile type game machines, electronic books, etc.), image players equipped with a recording medium (specifically, devices equipped with displays each of which is capable of playing a recording medium such as a digital versatile disk (DVD). and displaying the image thereof), and the like. In particular, as for a portable information terminal whose screen is often viewed from a diagonal direction, since a wide angle of view is regarded as important, it is desirable that a display device with a light emitting element be used. Specific examples of these electrical appliances are shown in FIG. 9.

Figure 9A:
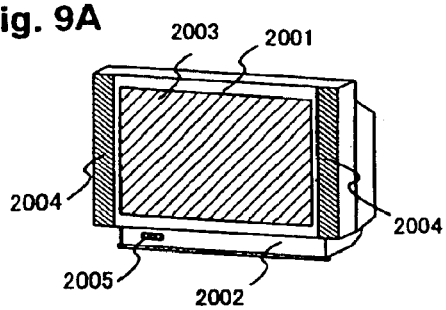
FIGS. 9A to 9G show electrical appliances employing the present invention.

FIG. 9A shows a display device, which includes a frame 2001, a support base 2002, a display portion 2003, a speaker portion 2004, a video input terminal 2005 and the like. A light emitting element or a liquid crystal element each provided with a TFT formed according to the present invention may be applied to the display portion 2003. Note that all light emitting devices for displaying information including light emitting devices for personal computers, those for receiving TV broadcasting, those for displaying advertising, and the like are also included in the display device.

Figure 9B:
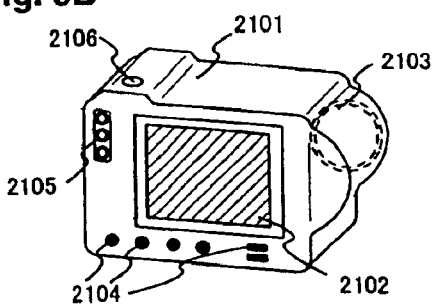

FIG. 9B shows a digital still camera, which includes a main body 2101, a display portion 2102, an image-receiving portion 2103, operation keys 2104, an external connection port 2105, a shutter 2106 and the like. A light emitting element or a liquid crystal element each provided with a TFT formed according to the present invention may be applied to the display portion 2102.

Figure 9C:
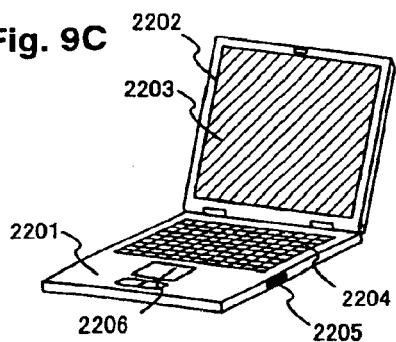

FIG. 9C shows a notebook type personal computer, which-includes a main body 2201, a frame 2202, a display portion 2203, a keyboard 2204, external connection ports 2205, a pointing mouse 2206, and the like. A light emitting element or a liquid crystal element each provided with a TFT formed according to the present invention may be applied to the display portion 2203.

Figure 9D:
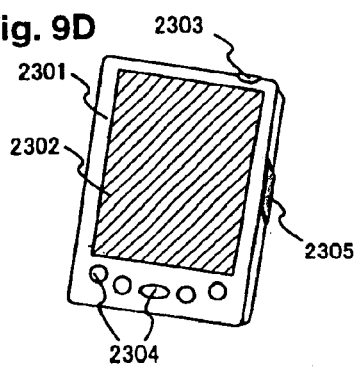

FIG. 9D shows a mobile computer, which includes a main body 2301, a display portion 2302, switches 2303, operation keys 2304, an infrared port 2305, and the like. A light emitting element or a liquid crystal element each provided with a TFT formed according to the present invention may be applied to the display portion 2302.

Figure 9E:
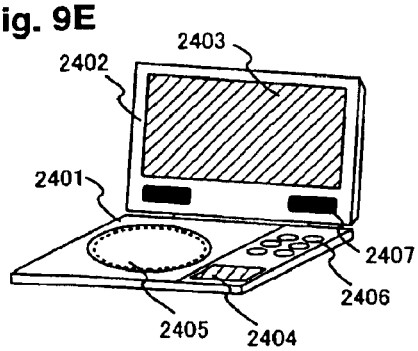

FIG. 9E shows a portable image player provided with a recording medium (specifically, a DVD player), which includes a main body 2401, a frame 2402, a display portion A 2403, a display portion B 2404, a recording medium (such as a DVD) read-in portion 2405, operation keys 2406, a speaker portion 2407, and the like. A light emitting element or a liquid crystal element each provided with a TFT formed according to the present invention can be used in both the display portion A 2403 and in the display portion B 2404 while the display portion A 2403 mainly displays image information, and the display portion B 2404 mainly displays character information. Note that image players provided with a recording medium include game machines for domestic use.

Figure 9F:
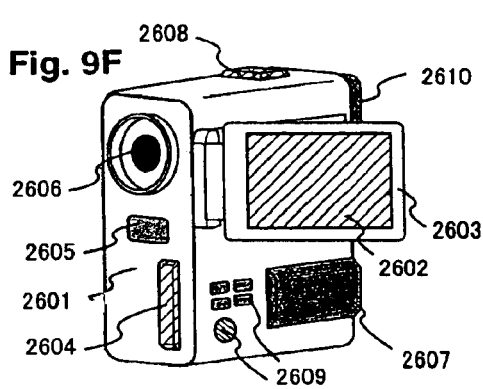

FIG. 9F shows a video camera, which includes a main body 2601, a display portion 2602, a frame 2603, external connection ports 2604, a remote-controlled receiving portion 2605, an image receiving portion 2606, a battery 2607, an audio input portion 2608, operation keys 2609, an eye piece 2610, and the like. A light emitting element or a liquid crystal element each provided with a TFT formed according to the present invention may be applied to the display portion 2602.

Figure 9G:
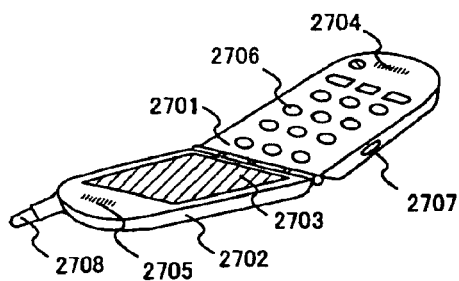

Here, FIG. 9G shows a mobile telephone, which includes a main body 2701, a frame 2702, a display portion 2703, an audio input portion 2704, an audio output portion 2705, operation keys 2706, external connection ports 2707, an antenna 2708, and the like. A light emitting element or a liquid crystal element each provided with a TFT formed according to the present invention may be applied to the display portion 2703. Note that by displaying white characters on a black background, the display portion 2703 can suppress the power consumption of the mobile telephone.

As described above, the present invention can be widely applied to and used in electrical appliances in various fields. Further, the electrical appliances of this embodiment may employ any one of the pixel structure or driver circuit configurations of Embodiment Modes 2 to 5.

Embodiment 2

In the electrical appliances shown in Embodiment 1, a module in a state, in which ICs including a controller, a power supply circuit, and the like are provided, is mounted to a panel in a state in which light emitting elements or liquid crystal elements are sealed. The module and the panel, each corresponds to a form of a display device. In this embodiment, a specific structure of the module will be described.

Figure 10A:
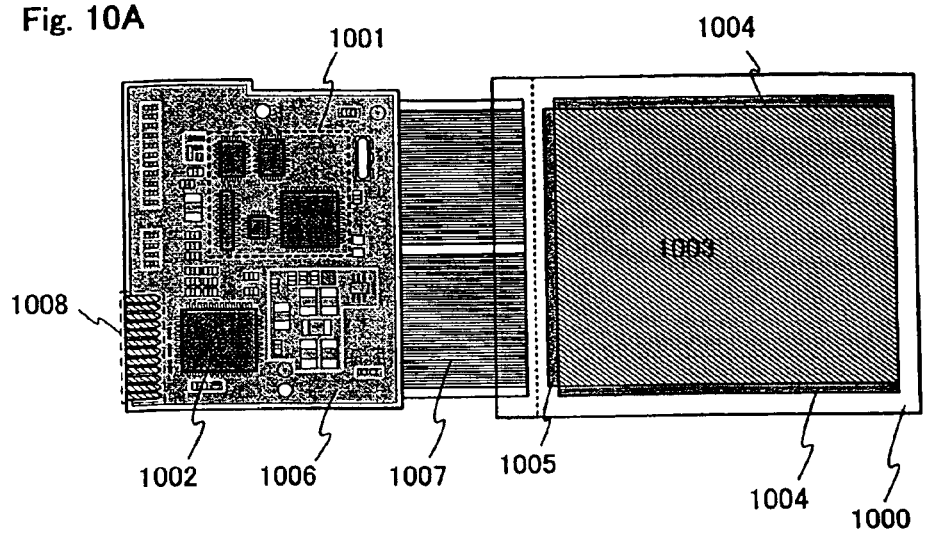
FIGS. 10A and 10B show a module of an electrical appliance employing the present invention.

FIG. 10A shows an appearance of a module in which a panel 1000 is provided with a controller 1001 and a power supply circuit 1002. There are provided in the panel 1000 a pixel portion 1003 in which a light emitting element is provided in each pixel, a scanning line driver circuit 1004 for selecting a pixel in the pixel portion 1003, and a signal line driver circuit 1005 for supplying a video signal to the selected pixel.

Further, the controller 1001 and the power supply circuit 1002 are provided in a printed substrate 1006. Respective signals and power supply voltage, which are output from the controller 1001 or the power supply circuit 1002, are supplied via FPC 1007 to the pixel portion 1003, the scanning line driver circuit 1004, and the signal line driver circuit 1005.

The power supply voltage and the respective signals are supplied to the printed substrate 1006 through an interface (I/F) portion 1008 on which plural input terminals are arranged.

Note that, although the printed substrate 1006 is mounted to the panel 1000 with the use of the FPC in this embodiment, the present invention is not necessarily limited to the structure. The controller 1001 and the power supply circuit 1002 may be directly mounted to the panel 1000 by using a COG (chip on glass) method Further, in the printed substrate 1006, noise develops to the power supply voltage or signal, or the rise of the signal becomes slow due to a capacitance formed between drawn wirings, resistance of the wiring itself, and the like in some cases. Therefore, various elements such as a capacitor and a buffer may be provided to the printed substrate 1006, thereby preventing the noise from developing to the power supply voltage or signal or preventing the rise of the signal from becoming slow.

Figure 10B:
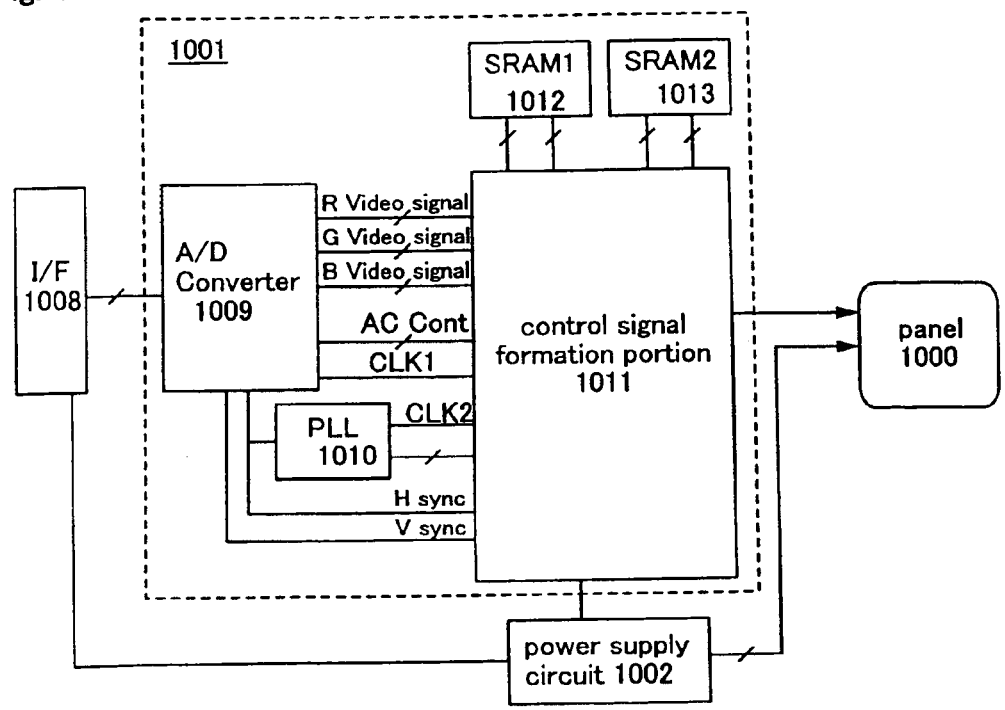

FIG. 10B is a block diagram of a structure of the printed substrate 1006. The respective signals and the power supply voltage supplied to the interface 1008 are supplied to the controller 1001 and the power supply circuit 1002.

The controller 1001 includes, a phase locked loop (PLL) 1010, and a control signal forming portion 1011; if necessary, an A/D converter 1009, SRAM (static random access memory) 1012 and SRAM 1013 are provided thereon. The provision of the A/D converter and the SRAMS depend on whether signals to be inputted are analog signals or digital signals, or the case where a pixel structure of a panel is controlled by either of analog signals or digital signals. Besides, an SRAM is provided in the case of performing digital drive. Note that, instead of the SRAM, an SDRAM may also be used, or a DRAM (dynamic random access memory) may also be used as long as writing and reading of data can be performed at high speed.

The video signals supplied through the interface 1008 are subjected to parallel-serial conversion in the A/D converter 1009, and the resultant signals, which serve as the video signals corresponding to the respective colors of R, G, and B, are inputted to the control signal forming portion 1011. Further, an Hsync signal, Vsync signal, clock signal CLK, and an alternating voltage (AC Cont) are generated in the A/D converter 1009 based on the respective signals supplied through the interface 1008, and are inputted to the control signal forming portion 1011.

The phase locked loop 1010 has a function of adjusting a phase of a frequency of each of the signals supplied through the interface 1008 to a phase of an operation frequency of the control signal forming portion 1011. The operation frequency of the control signal forming portion 1011 is not necessarily the same as the frequency of each of the signals supplied through the interface 1008. Thus, the operation frequency of the control signal forming portion 1011 is regulated in the phase locked loop 1010 for synchronization of the above phases.

When signals inputted into control signal forming portion 1011 are video signals, the video signals are once written in the SRAM 1012 and SRAM 1013 and stored therein. In the control signal forming portion 1011, the video signals corresponding to all the pixels are read out among the video signals of all the bits held in the SRAM on a bit-by-bit basis, and are supplied to the signal line driver circuit 1005 of the panel 1000.

Further, information of each bit on a period during which a light emitting element emits light is supplied from the control signal forming portion 1011 to the scanning line driver circuit 1004 of the panel 1000.

Still further, a predetermined power supply voltage is supplied from the power supply circuit 1002 to the signal line driver circuit 1005, the scanning line driver circuit 1004, and the pixel portion 1003 of the panel 1000.

Next, a structure of the power supply circuit 1002 is described in detail with reference to FIG. 10. The power supply circuit 1002 in this embodiment is composed of a switching regulator 1054 in which four switching regulator controls 1060 are used and a series regulator 1055.

In general, the switching regulator is small in size and light in weight compared with the series regulator, and can be used for not only drop in voltage but also rise in voltage and positive-negative inversion. On the contrary, the series regulator is used only for the drop in voltage. However, the series regulator is satisfactory in terms of precision in an output voltage compared with the switching regulator, and hardly involves the occurrence of ripple and noise. Both the regulators are used in combination in the power supply circuit 1002 in this embodiment.

Figure 11:
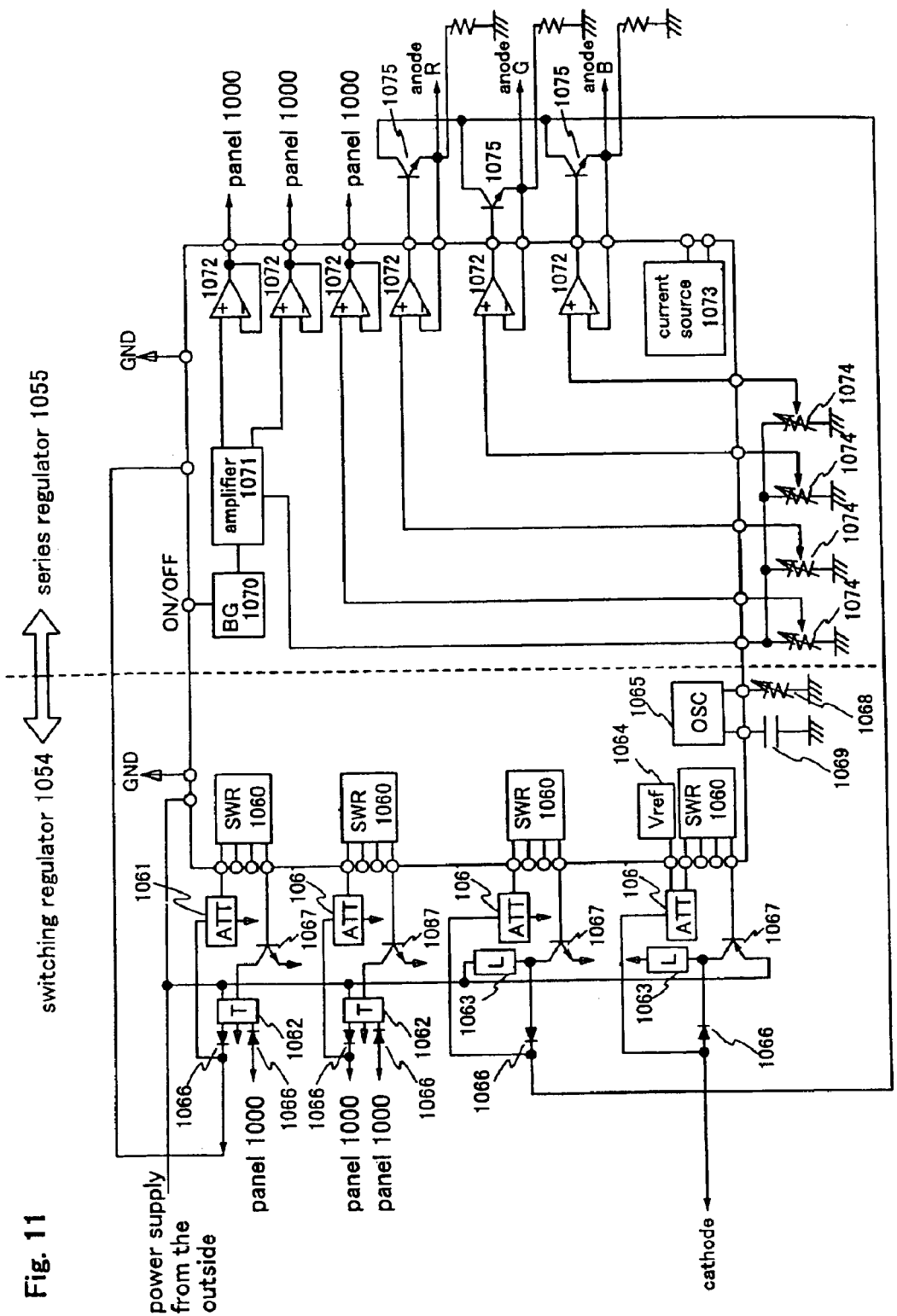
FIG. 11 shows a power supply circuit of an electrical appliance employing the present invention.

The switching regulator 1054 in FIG. 11 includes the switching regulator controls (SWR) 1060, attenuators (ATT) 1061, transformers (T) 1062, inductors (L) 1063, a reference power supply (Vref) 1064, an oscillation circuit (OSC) 1065, diodes 1066, bipolar transistors 1067, a variable resistor 1068, and a capacitor 1069.

A voltage of an external Li ion battery (3.6 V) or the like is converted in the switching regulator 1054, whereby the power supply voltage imparted to a cathode and the power supply voltage to be supplied to the series regulator 1055 are generated.

Further, the series regulator 1055 includes a band gap circuit (BG) 1070, an amplifier 1071, operational amplifiers 1072, a current source 1073, variable resistors 1074, and bipolar transistors 1075. The power supply voltage generated in the switching regulator 1054 is supplied to the series regulator 1055.

In the series regulator 1055, a direct-current power supply voltage, which is to be, imparted to a wiring (current supply line) for supplying a current to an anode of a light emitting element for each color, is generated using the power supply voltage generated in the switching regulator 1054 on the basis of a constant voltage generated in the band gap circuit 1070.

Note that the current source 1073 is used in case where a driving method in which a current serving as a video signal is written to a pixel. In this case, a current generated in the current source 1073 is supplied to the signal line driver circuit 1005 of the panel 1000. Note that the current source 1073 is not necessarily provided in case where a driving method in which a voltage serving as a video signal is written to a pixel is employed.

Note that the switching regulator, OSC, amplifier, and operational amplifier can be formed by using the above-described manufacturing method.

What is claimed is:

1. A thin film transistor comprising a crystalline semiconductor film over an insulating surface,
    wherein the crystalline semiconductor film contains a metallic element for promoting crystallization at a concentration lower than $4\times10^{16}$ atoms/cm$^3$ and oxygen at $5\times10^{19}$ atoms/cm$^3$ to $1\times10^{21}$ atoms/cm$^3$.

2. A thin film transistor comprising a crystalline semiconductor film over an insulating surface,
    wherein the crystalline semiconductor film contains a metallic element for promoting crystallization at a concentration of $5\times10^{15}$ atoms/cm$^3$ to $3\times10^{16}$ atoms/cm$^3$ and oxygen at $5\times10^{19}$ atoms/cm$^3$ to $1\times10^{21}$ atoms/cm$^3$.

3. A thin film transistor comprising a crystalline semiconductor film over an insulating surface,
    wherein the crystalline semiconductor film contains a metallic element for promoting crystallization at a concentration of $7\times10^{15}$ atoms/cm$^3$ to $3\times10^{16}$ atoms/cm$^3$ and oxygen at $1\times10^{20}$ atoms/cm$^3$ to $6\times10^{20}$ atoms/cm$^3$.

4. An EL display device comprising a thin film transistor according to claim 1.

5. An EL display device comprising a thin film transistor according to claim 2.

6. An EL display device comprising a thin film transistor according to claim 3.

7. A liquid crystal display device comprising a thin film transistor according to claim 1.

8. A liquid crystal display device comprising a thin film transistor according to claim 2.

9. A liquid crystal display device comprising a thin film transistor according to claim 3.

* * * * *